(12) United States Patent
Wang et al.

(10) Patent No.: US 9,316,905 B2
(45) Date of Patent: Apr. 19, 2016

(54) CYCLODEXTRIN DERIVATIVES AND METHOD FOR PREPARING THE SAME, PHOTORESIST COMPOSITION AND DISPLAY DEVICE

(71) Applicant: BOE TECHNOLOGY GROUP CO., LTD., Beijing (CN)

(72) Inventors: Xuelan Wang, Beijing (CN); Chen Tang, Beijing (CN); Shan Chang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/573,672

(22) Filed: Dec. 17, 2014

(65) Prior Publication Data

US 2015/0378253 A1 Dec. 31, 2015

(30) Foreign Application Priority Data

Jun. 30, 2014 (CN) .......................... 2014 1 0309341

(51) Int. Cl.
| | | |
|---|---|---|
| *G03F 7/004* | (2006.01) | |
| *C08B 31/02* | (2006.01) | |
| *G03F 7/00* | (2006.01) | |
| *C08L 5/16* | (2006.01) | |
| *C08B 37/16* | (2006.01) | |

(Continued)

(52) U.S. Cl.
CPC ................ *G03F 7/004* (2013.01); *C08B 31/02* (2013.01); *C08B 37/0012* (2013.01); *C08F 8/46* (2013.01); *C08L 5/16* (2013.01); *C09K 19/42* (2013.01); *G03F 7/0007* (2013.01)

(58) Field of Classification Search
CPC ......... C08L 5/16; C08B 37/0012; C08F 8/46; G03F 7/0007; G03F 7/0045; G03F 7/027; C09K 19/42
USPC .......... 430/281.1, 285.1, 7; 525/329.5, 54.21; 524/48; 428/1.1
See application file for complete search history.

(56) References Cited

U.S. PATENT DOCUMENTS

| | | | | |
|---|---|---|---|---|
| 5,276,088 | A * | 1/1994 | Yoshinaga ............. | B01D 71/08 525/54.3 |
| 6,180,739 | B1 * | 1/2001 | Bowen ................ | A61K 6/0023 506/15 |

(Continued)

FOREIGN PATENT DOCUMENTS

JP 08-100027 A * 4/1996 ................ C08F 8/46

*Primary Examiner* — Amanda C Walke
(74) *Attorney, Agent, or Firm* — Nath, Goldberg & Meyer; Joshua B. Goldberg; Tanya E. Harkins

(57) ABSTRACT

The present invention relates to a cyclodextrin derivative, a method for preparing the same, a photoresist composition, a color photoresist and a display device. The cyclodextrin derivative particularly is a .alpha.-cyclodextrin modified polymerizable monomer represented by the following formula I or I', wherein k is any integer selected from 2-6, n is any integer selected from 1-3, R is an aromatic ring having 5 to 30 carbon atoms, R' is a multivalent straight or branched carbon chain having 5 to 30 carbon atoms which may optionally be interrupted by an oxygen atom. The α-cyclodextrin modified polymerizable monomer can be applied to a photoresist composition which has small aberration and high transmittance, thereby improving the display quality of the display apparatus.

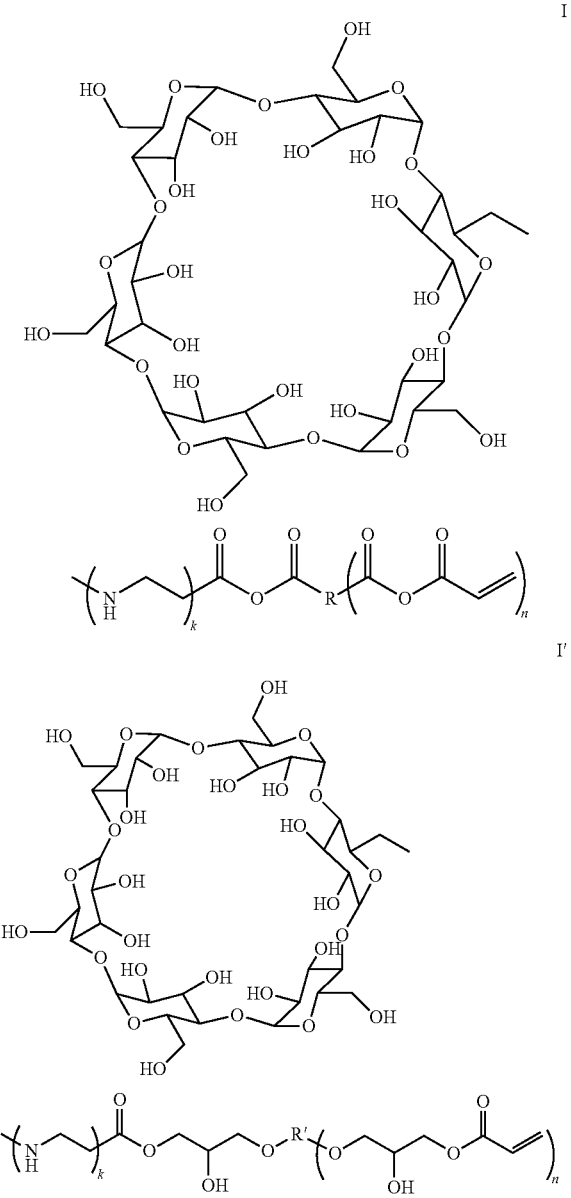

9 Claims, No Drawings

(51) Int. Cl.
*C08F 8/46* (2006.01)
*C09K 19/42* (2006.01)

(56) References Cited

U.S. PATENT DOCUMENTS 8,927,098 B2 * 1/2015 Jung ................... C08B 37/0012
428/220

2009/0286908 A1 * 11/2009 Kwak ..................... C08F 14/06
524/48
2012/0202772 A1 * 8/2012 Glucksmann .... A61K 47/48169
514/58
2012/0270927 A1 * 10/2012 Reineke ............... C12N 15/113
514/44 A
2015/0141638 A1 * 5/2015 Ryan ................... A61K 9/0019
536/46

* cited by examiner

CYCLODEXTRIN DERIVATIVES AND METHOD FOR PREPARING THE SAME, PHOTORESIST COMPOSITION AND DISPLAY DEVICE

FIELD OF THE INVENTION

The present invention relates to the technical field of display, in particular, to a cyclodextrin derivative, a method for preparing the same, a photoresist composition, a color photoresist and a display device.

BACKGROUND OF THE INVENTION

In flat-panel display device, thin film transistor liquid crystal displays (TFT-LCD) have become the dominant product for its small size, low power dissipation, relatively low cost and no irradiation.

At present, the main structure of TFT-LCD comprises an array substrate and a color filter (CF) substrate, wherein the CF substrate mainly comprises a glass substrate, a black matrix (BM), a color photoresist and an outside cover. The main effect of the color photoresist is to provide the three-primary colors of Red, Green and Blue by means of light-filtering and then mix the three-primary colors in different ratio in terms of strength so as to obtain a variety of colors, thereby presenting full-color by the TFT-LCD.

A color photoresist is a cured film obtained by coating a photoresist composition, photo-curing and developing. Usually, the main components of a photoresist composition include an alkali-soluble resin, a polymerizable monomer having high degree of functionality, an initiator, a pigment dispersion, an organic solvent, etc. When the polymerizable monomer having high degree of functionality has aromatic ring or ether chain, the cured film formed by the photoresist comprising such monomer will yellowing badly, i.e. the color-change phenomenon is serious, and the transmittance thereof is low.

Thus, it is desired to provide an improved photoresist composition which can reduce the yellowing phenomenon and increase the transmittance.

SUMMARY OF THE INVENTION

In first aspect, the present invention provides a cyclodextrin derivative, particularly a α-cyclodextrin modified polymerizable monomer represented by the following formula I or I':

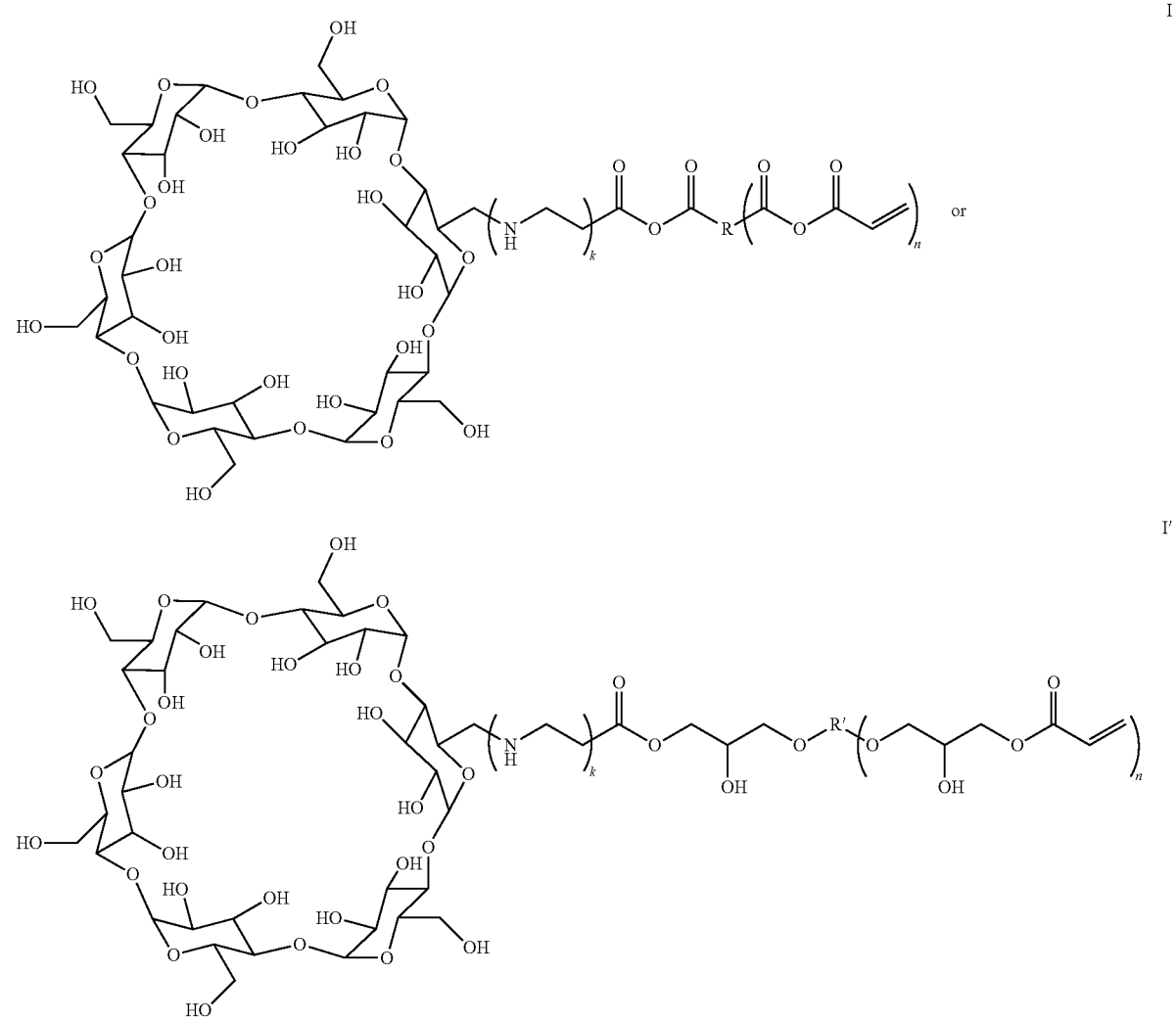

wherein k is any integer selected from 2-6, n is any integer selected from 1-3, R is an aromatic ring having 5 to 30 carbon atoms, R' is a multivalent straight or branched carbon chain having 5 to 30 carbon atoms which may optionally be interrupted by an oxygen atom.

The valence of the R' depends on the number n. Preferably, R includes phenyl ketone, naphthyl ketone; and R' may be the carbon chain of glycerol ethers.

In another aspect, the present invention also provides a photoresist composition comprising:

2.3 to 8.6 parts by weight of any one of the above α-cyclodextrin modified polymerizable monomer;

10 to 20 parts by weight of a polymerizable monomer with high functionality;

3.2 to 15.8 parts by weight of an alkali-soluble resin;

15 to 30 parts by weight of a pigment dispersion;

0.1 to 0.8 parts by weight of a photoinitiator; and 20 to 30 parts by weight of an organic solvent.

Preferably, the α-cyclodextrin modified polymerizable monomer is in a range of 2.5 to 4.5 parts by weight; the polymerizable monomer with high functionality is in a range of 13 to 15 parts by weight; the alkali-soluble resin is in a range of 5 to 7 parts by weight; the pigment dispersion is in a range of 20 to 25 parts by weight; the photoinitiator agent is in a range of 0.3 to 0.5 parts by weight; the organic solvent is a range of 25 to 27 parts by weight.

Preferably, as the polymerizable monomers with high functionality, dipentaerythritol pentaacrylate, dipentaerythritol hexaacrylate, or di-trimethylolpropane tetraacrylate may be exemplified. As the alkali-soluble resin, acrylic resin may be exemplified. As the pigment dispersion, a red pigment dispersion, a green pigment dispersion or a blue pigment dispersion may be exemplified. As the photoinitiator, 4,4'-diphenyl iodonium hexafluoroantimonate, mixed-type of triaryl sulfonium hexafluoroantimonate, (5-Cyclopentadienyl) (6-isopropylbenzene)iron hexafluorophosphate or 1-(4-(phenylthio)phenyl)-1,2-octanedione-2-(O-benzoyl oxime). As the organic solvent, for example, propylene glycol methyl ether acetate, propylene glycol diacetate, 3-ethoxy-3-imino ethyl propionate, 2-methyl heptane, 3-methyl heptane, cyclopentanone and cyclohexanone may be exemplified, and these solvents may be used alone, or in combination of two or more.

Preferably, the photoresist composition further comprises 0.04 to 0.09 parts by weight of additives.

Preferably, the additive is a surfactant or a leveling agent.

In yet another aspect, the present invention also provides a color photoresist obtained from any one of the above photoresist composition.

In yet another aspect, the present invention also provides a display apparatus, the color photoresist of which is obtained from any one of the above photoresist composition.

In a further aspect, the present invention also provides a method for preparing the above cyclodextrin derivative, comprising:

Step A: performing an esterification reaction of α-cyclodextrin and p-toluenesulfonyl chloride under basic condition to form mono-(6-p-toluenesulfonyl)-α-cyclodextrin according to the chemical equation as below:

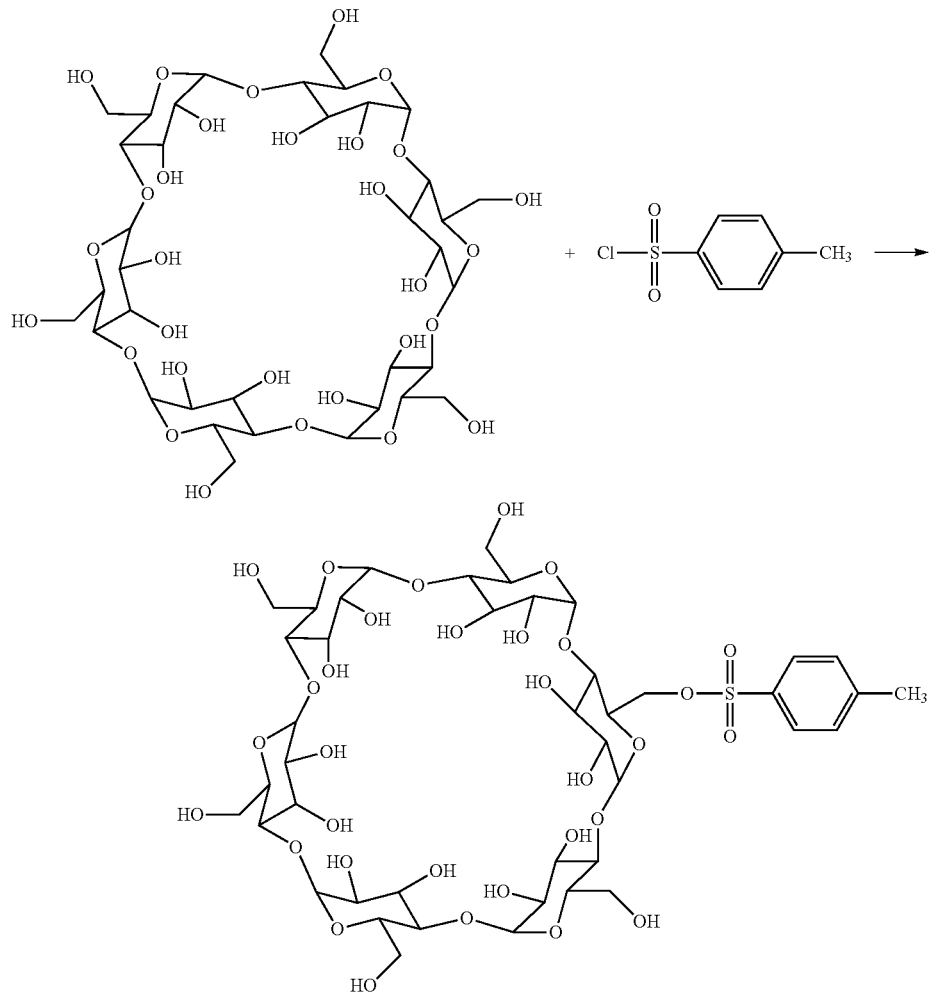

Step B: performing a substitution reaction of mono-(6-p-toluenesulfonyl)-α-cyclodextrin and polyamine compounds II to form compound III according to the chemical equation as below:

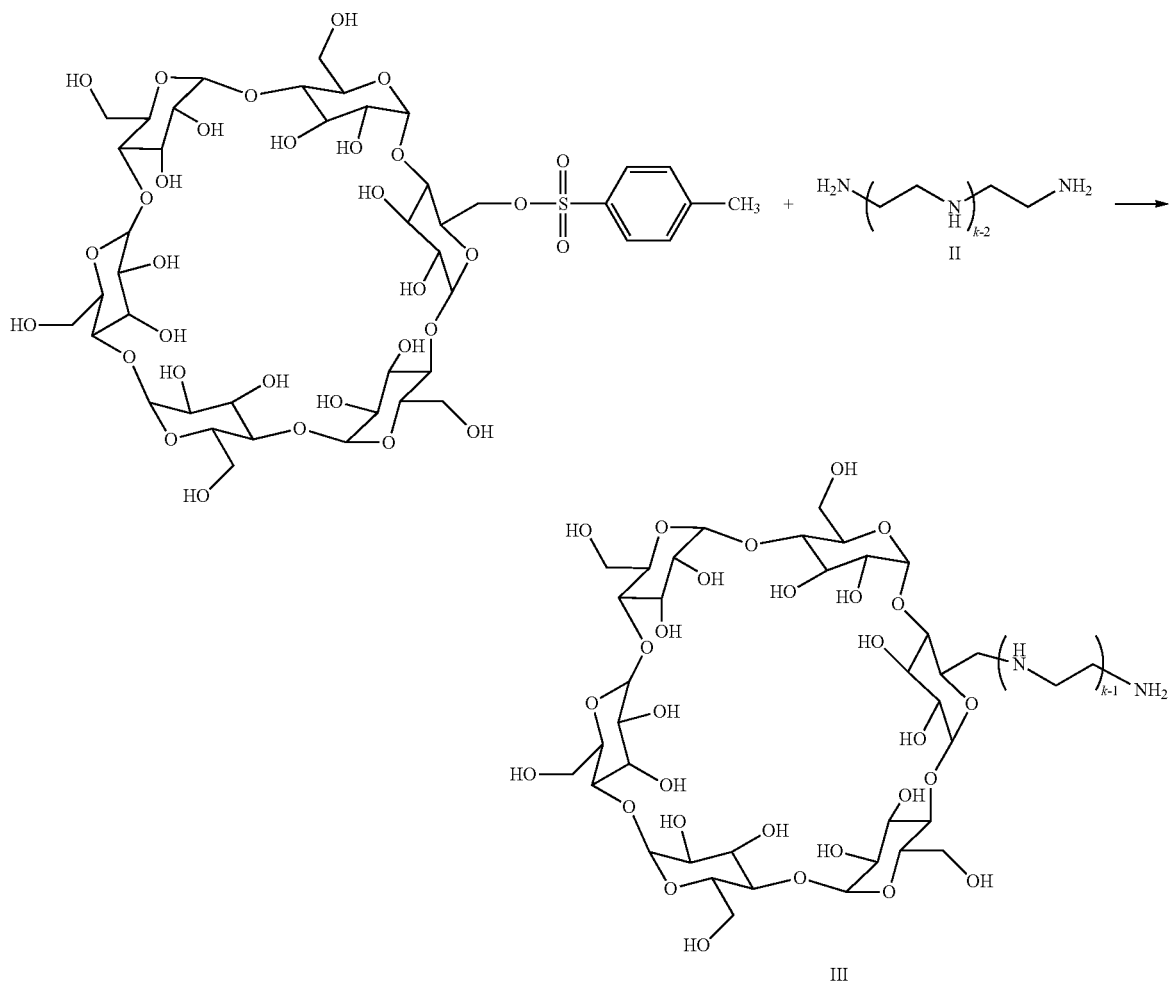

Step C: performing an addition reaction of compound III and polymerizable monomer IV or IV' to form a compound represented by formula I or I' according to the chemical equation as below:

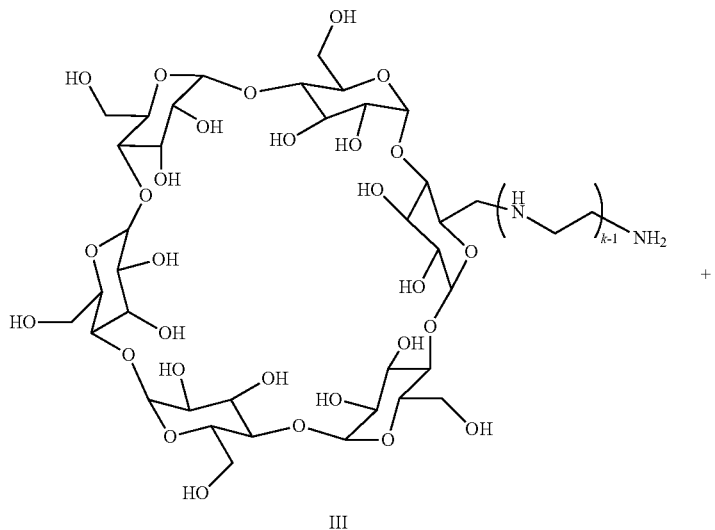

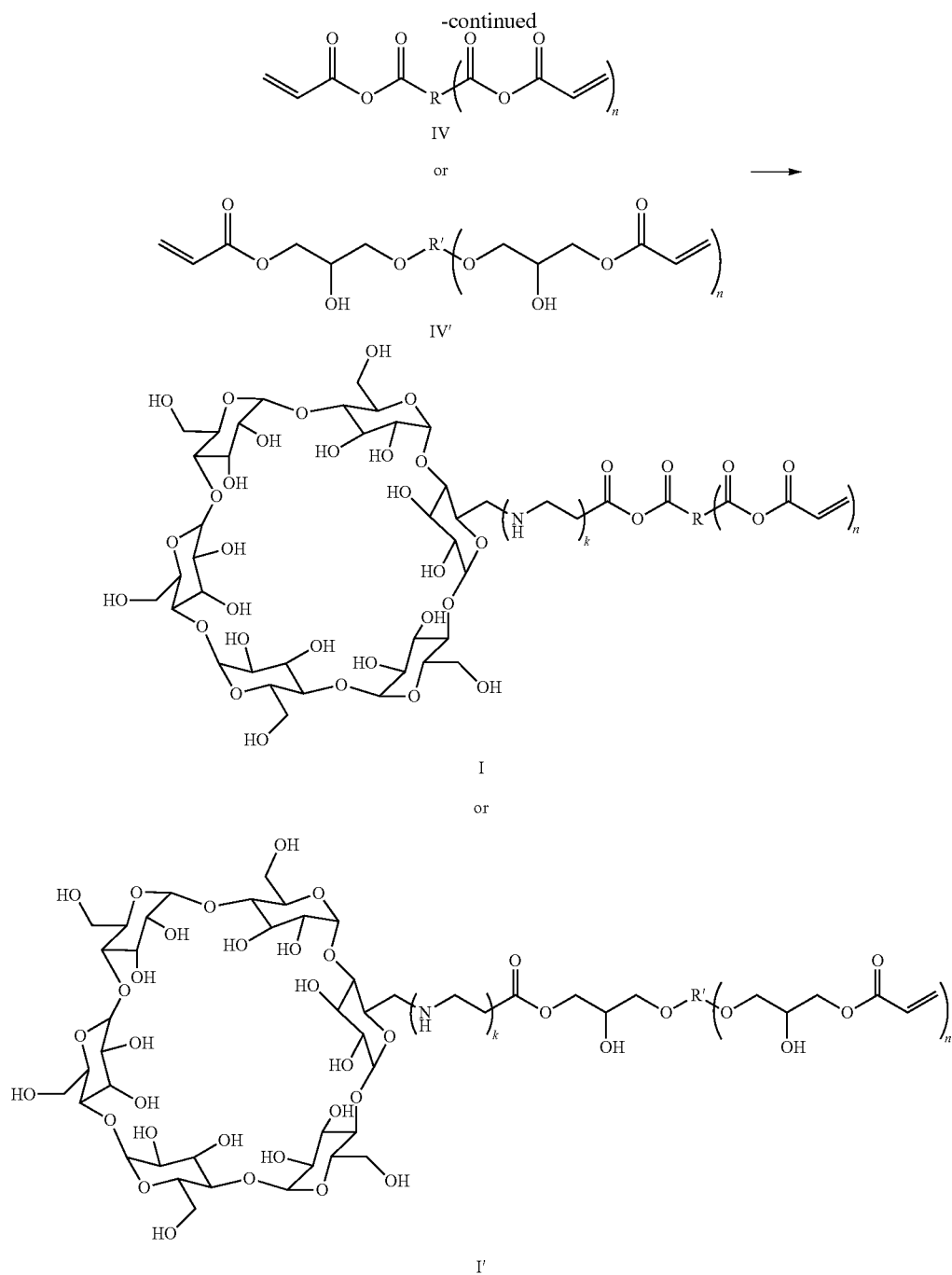

wherein k is any integer selected from 2-6, n is any integer selected from 1-3, R is an aromatic ring having 5 to 30 carbon atoms, R' is a multivalent straight or branched carbon chain having 5 to 30 carbon atoms which may be optionally interrupted by an oxygen atom.

DETAILED DESCRIPTION OF CERTAIN EMBODIMENTS

The present invention provides a cyclodextrin derivative and a method for preparing the same, a photoresist composition comprising the cyclodextrin derivative, a color photoresist formed from the photoresist composition, and the display apparatus comprising the color photoresist, so as to address the problems that the cured film formed from the photoresist composition of the prior art is apt to yellowing, and the transmittance thereof is low.

Embodiments of the present invention will be described in detail with reference to the accompanying figures, so that a person skilled in the art can get a better understanding of the technical solutions of the invention.

An embodiment according to the present invention provides a cyclodextrin derivative which is a α-cyclodextrin modified polymerizable monomer represented by the following formula I or I':

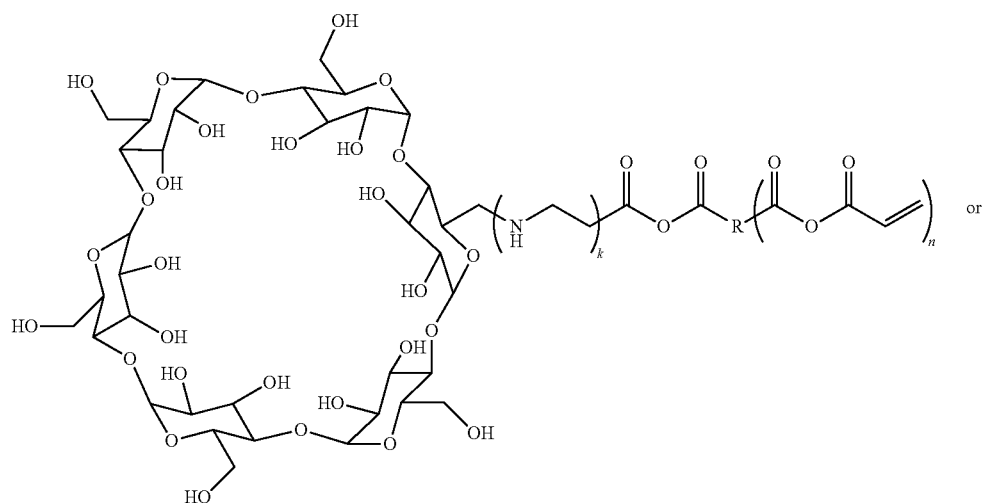

I

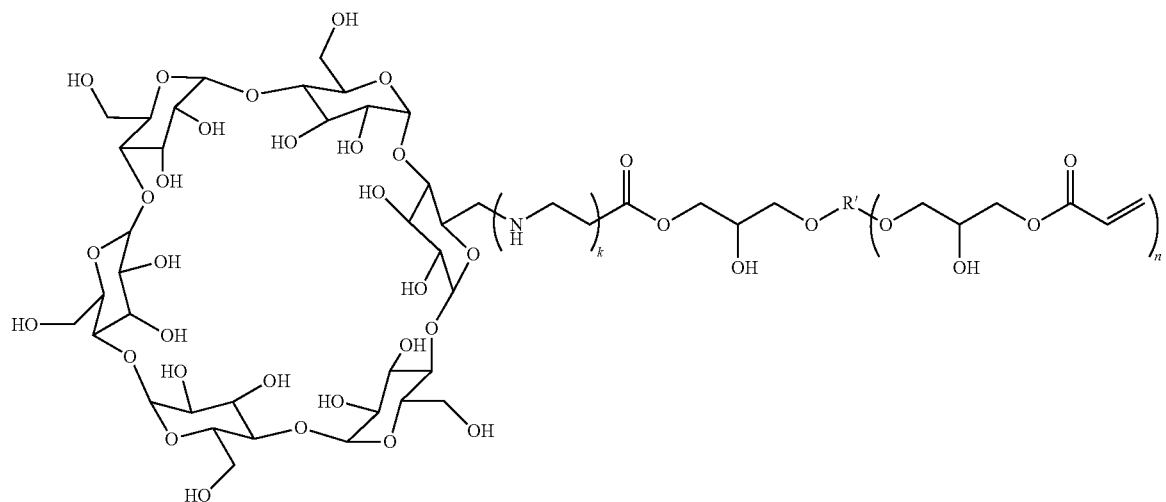

I' wherein k is any integer selected from 2-6, n is any integer selected from 1-3, R is an aromatic ring having 5 to 30 carbon atoms, R' is a multivalent straight or branched carbon chain having 5 to 30 carbon atoms which may be optionally interrupted by an oxygen atom, and the valence of the carbon chain depends on the number n. For example, R may be a benzene ring, a naphthalene ring, a pyridine group, or a pyrrole group which is substituted by methyl, ethyl and the like.

In this technical solution, the cyclodextrin derivative is a polymerizable monomer modified by α-cyclodextrin. The special structure of the hydrophobic cavity of α-cyclodextrin enables it to bond a variety of guest molecules so as to form a supramolecular inclusion complexes; for example, it may include guest molecules having an aromatic ring or ether structure, thus preventing the aromatic ring or ether structure which is apt to yellowing being exposed to the external environment. Therefore, when such cyclodextrin derivatives are used in a photoresist composition, the yellowing phenomenon of the cured film (i.e., color photoresist) formed from the photoresist composition can be significantly improved, and the transmittance of the cured film can also be improved. Therefore, the display quality of a display panel can be significantly improved due to the improved performances of the cured film.

Preferably, R includes phenyl ketone, naphthyl ketone; and R' may be the carbon chain of glycerol ethers. It should be understood that R or R' may be substituted by a aromatic ring or a ether group, as well as alkyl (such as methyl or ethyl) and alkoxy (such as methoxy and ethoxy).

Preferably, R may be the two groups as follows:

1)

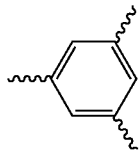

wherein the curves represent the connecting positions, one of which connects the carbonyl near the cyclodextrin, the other two of which connect the carbonyl near the acrylate groups;

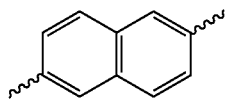

2)

wherein the curves represent the connecting positions, one of which connects the carbonyl near the cyclodextrin, the other of which connects the carbonyl near the acrylate group.

R' may be the two groups as follows:

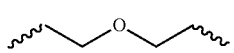

1)

wherein the curves represent the connecting positions, one of which connects the oxygen atom near the α-cyclodextrin, the other of which connects the oxygen atom near the acrylate group;

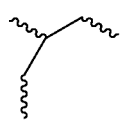

2)

wherein the curves represent the connecting positions, one of which connects the oxygen atom near the α-cyclodextrin, the other two of which connect the oxygen atom near the acrylate groups.

Another embodiment according to the present invention provides a photoresist composition comprising:

2.3 to 8.6 parts by weight of any one of the above α-cyclodextrin modified polymerizable monomer;

10 to 20 parts by weight of the polymerizable monomer with high functionality;

3.2 to 15.8 parts by weight of the alkali-soluble resin;

15 to 30 parts by weight of the pigment dispersion;

0.1 to 0.8 parts by weight of the photoinitiator; and 20 to 30 parts by weight of an organic solvent.

For the α-cyclodextrin modified polymerizable monomer, when the amount thereof is too low, the inclusion rate of the aromatic ring or ether chain will thereby be reduced, thus the yellowing phenomenon of the cured film formed from the photoresist composition can not be improved or improved less obviously. When the amount thereof is too large, the cost will be increased. Preferably, the α-cyclodextrin modified polymerizable monomer is in a range of 2.5 to 4.5 parts by weight.

Preferably, as the polymerizable monomers with high functionality, dipentaerythritol pentaacrylate, dipentaerythritol hexaacrylate, or di-trimethylolpropane tetraacrylate may be exemplified. Preferably, the polymerizable monomer with high functionality is in a range of 13 to 15 parts by weight.

Preferably, as the alkali-soluble resin, for example, alkali-soluble acrylic resin may be exemplified. When the amount of the alkali-soluble resin is too small, the developing time of the cured film of the photoresist composition will become too long resulting in a longer production period and the cost being increased. When the amount of the alkali-soluble resin is too large, the developing time of the cured film of the photoresist composition will become too short which result the compactness of the film being poor and the transmittance being reduced. Preferably, the alkali-soluble resin is in a range of 5 to 7 parts by weight.

The pigment dispersion includes a red pigment dispersion, a green pigment dispersion or a blue pigment dispersion. The pigment of the dispersion is not particularly limited, and it can be selected according to the color of the desired color filter. For example, it may be red pigment, green pigment, yellow pigment, blue pigment, purple pigment, cyan pigment, black pigment and the like. Generally, the pigment should be used in the form of a pigment dispersion comprising (for example) the pigment, a dispersant and a corresponding solvent.

For the pigment dispersion, the chroma can not meet the requirements if the amount thereof is too small, and the cured film of the photoresist composition will be too rough if the amount thereof is too large. Preferably, the pigment dispersion is in a range of 20 to 25 parts by weight.

The photoinitiator includes acetophenones, benzoins, benzophenones, anthraquinones and the like, for example 4,4'-diphenyl iodonium hexafluoroantimonate, mixed-type of tri-aryl sulfonium hexafluoroantimonate, (5-Cyclopentadienyl)(6-isopropylbenzene)iron hexafluorophosphate or 1-(4-(phenylthio)phenyl)-1,2-octanedione-2-(O-benzoyl oxime). As for the photoinitiator, the unsaturated group can not polymerize completely so that the cured film is too rough, if the amount thereof is too small; and the line width of the image will be too large to meet the requirements if the amount thereof is too large. Preferably, the photoinitiator agent is in a range of 0.3 to 0.5 parts by weight.

The organic solvent is used to adjust the viscosity of the photoresist composition, and any organic solvent may be used provided that the organic solvent can dissolve the above components without reaction and has certain volatility. Preferably, propylene glycol methyl ether acetate, propylene glycol diacetate, 3-ethoxy-3-imino ethyl propionate, 2-methyl heptane, 3-methyl heptane, cyclopentanone and cyclohexanone may be exemplified, and these solvents may be used alone, or in combination of two or more. Preferably, the organic solvent is in a range of 25 to 27 parts by weight.

In addition to the above components, the photoresist composition may further comprise 0.04-0.09 parts by weight of additives. Preferably, the additive is a surfactant or a leveling agent. The additive may also be other additives. By use of the additive in the photoresist composition, the film-forming properties of a cured film can be improved.

Another embodiment according to the present invention provides a color photoresist which is formed by any of the above photoresist composition.

Another embodiment according to the present invention provides a display apparatus comprising the color photoresist. In addition to the color photoresists, the other configurations of the display apparatus are the same as the prior art. The display apparatus may be any product or member having display function, such as LCD panels, electronic paper, OLED panel, LCD TV, LCD monitors, digital photo frames, mobile phones, tablet PCs and the like.

Yet another embodiment according to the present invention further provides a method for preparing the above cyclodextrin derivative, comprising:

Step A: performing an esterification reaction of α-cyclodextrin and p-toluenesulfonyl chloride under basic condition to form mono-(6-p-toluenesulfonyl)-α-cyclodextrin according to the chemical equation as below:

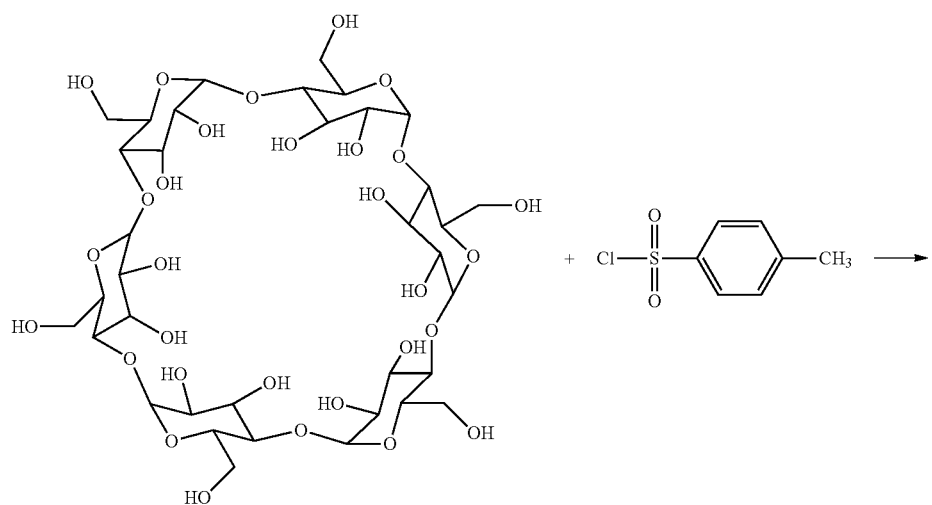
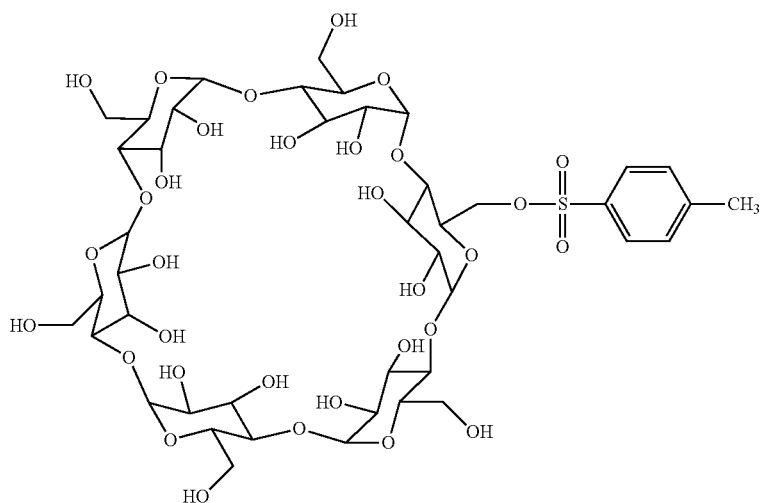
Step B: performing a substitution reaction of mono-(6-p-toluenesulfonyl)-α-cyclodextrin and polyamine compounds II to form compound III according to the chemical equation as below:
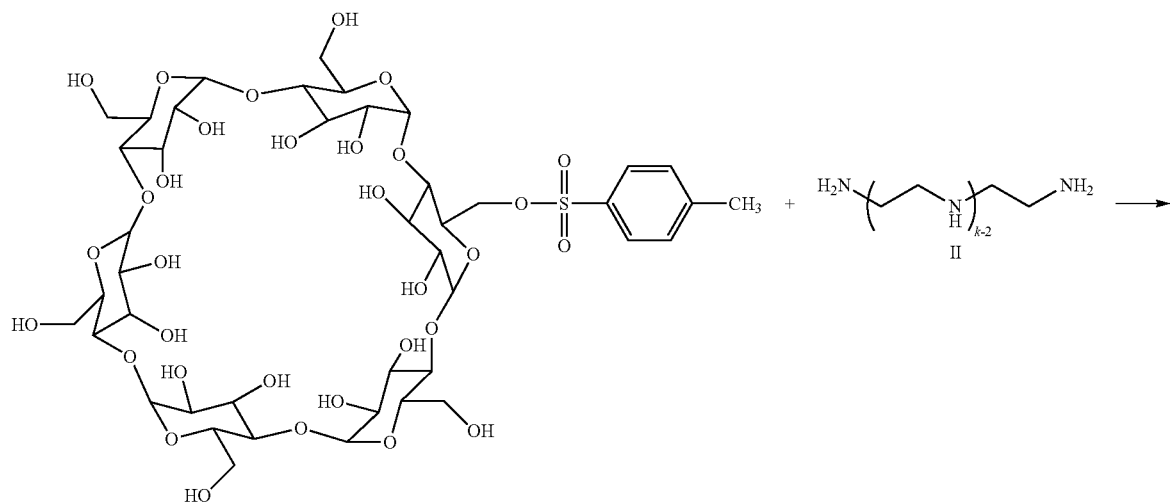

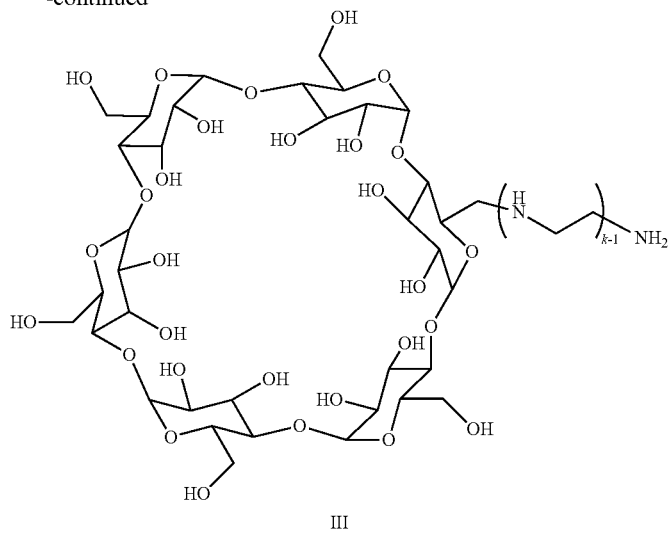
III
Step C: performing an addition reaction of compound III and polymerizable monomer compounds IV or IV to form a compound represented by formula I or I' according to the chemical equation as below:
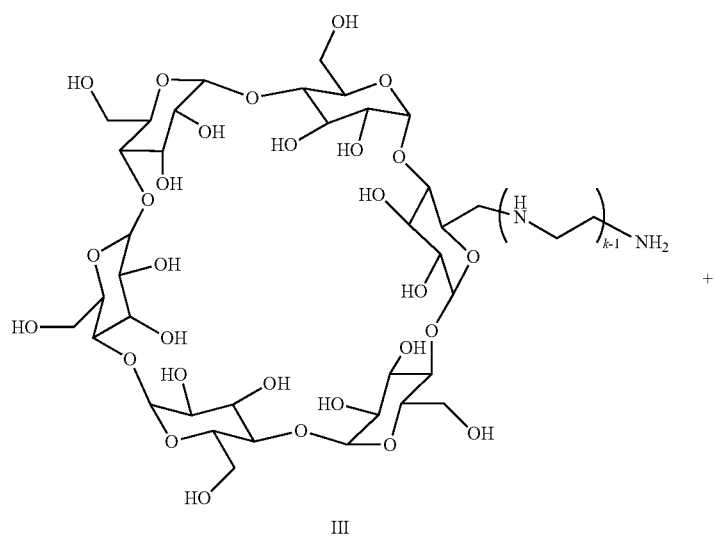
III
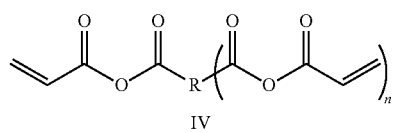
IV
or
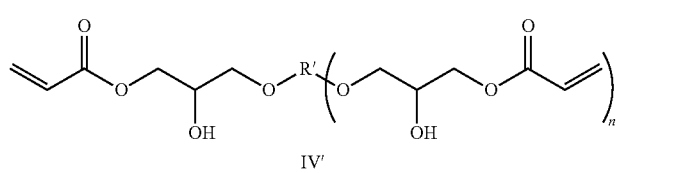
IV'

-continued

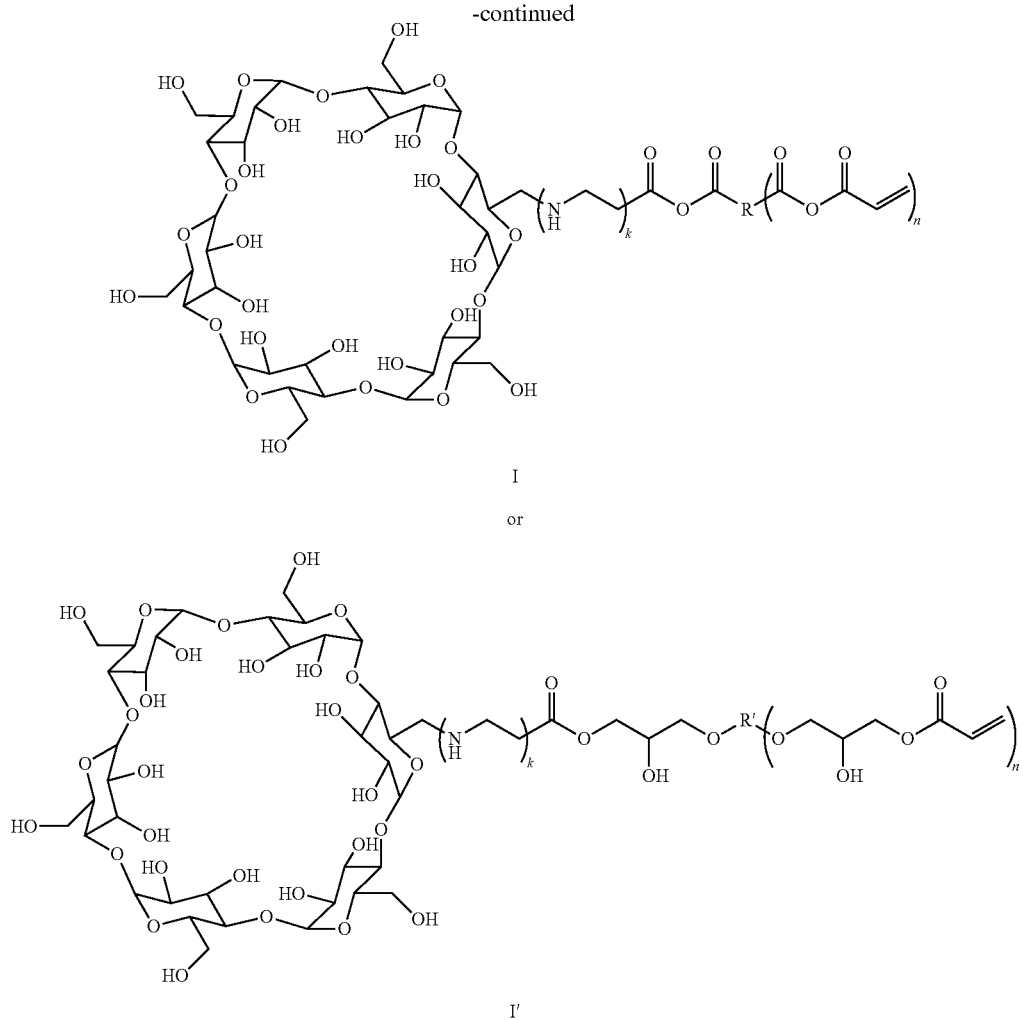

I or

I' wherein k is any integer selected from 2-6, n is any integer selected from 1-3, R is an aromatic ring having 5 to 30 carbon atoms, R' is a multivalent straight or branched carbon chain having 5 to 30 carbon atoms which may optionally be interrupted by an oxygen atom. The valence of the carbon chain depends on the number n. The polymerizable monomers IV or IV can be prepared or purchased, and if prepared, it can be obtained form the reaction of acid and acryloyl chloride or the reaction of ether and acryloyl chloride.

The glycidyl ether-acrylate polymerizable monomers can be prepared by the reaction of glycidyl ether and acryloyl chloride as follows:

1 part by weight of glycidyl ether and 2.5 to 5 parts by weight of acryloyl chloride are added into a three-neck flask, and then 15 to 25 parts by weight of N,N-dimethyl formamide as a solvent, and 0.1 to 0.5 parts by weight of imidazole as a reaction promoter are added therein. The reactants are heated to 90° C. to 140° C. with stirring under $N_2$ atmosphere and the reaction is kept for 4 to 24 h. Then the solvent of N,N-dimethyl formamide is removed by reduced pressure distillation, and the residual is dried under vacuum to obtain the glycidyl ether-acrylate polymerizable monomer.

Yet another embodiment according to the present invention also provides a method for preparing a photoresist composition, comprising:

providing the α-cyclodextrin modified polymerizable monomer, the polymerizable monomer with high functionality, the alkali-soluble resin, the pigment dispersion, the photoinitiator and the organic solvent according to the above parts by weight, and mixing them well.

EXAMPLES

The α-cyclodextrin modified polymerizable monomer and the method for preparing the same, as well as the photoresist composition and the method for preparing the same according to the present invention are further described by the following examples. It should be understood that the present invention is not limited to these examples.

It should be noted that, unless otherwise specified, the components of the photoresist composition are presented in parts by weight.

Firstly, mono-(6-p-toluenesulfonyl)-α-cyclodextrin (hereinafter simply referred to as 6-OTs-α-CD) was prepared according to the chemical equation of the above Step A:

300 ml of water was added into a 500 ml reactor, and then 50 g of α-cyclodextrin was added in batches under stirring while the formed solution is maintained at 10 to 20° C. with a water bath. An aqueous solution of sodium hydroxide (5 g sodium hydroxide dissolved in 15 ml water) was added dropwise to the solution, the stirring was continued for one more hour after the α-cyclodextrin is dissolved completely, and then an acetonitrile solution of p-toluenesulfonyl chloride (7.5 g p-toluenesulfonyl chloride dissolved in 22.5 ml acetonitrile) was slowly added dropwise to the above solution, the stirring was continued for 2-2.5 hours at constant temperature after the addition. Insolubles was filtered off, and the pH of the solution was adjusted to 8-9 with 10% hydrochloric acid solution followed by standing one day and a night at about 2° C. to precipitate large mounts of white precipitate. The precipitate was collected by filtration, and then recrystallized three times with water and dried under vacuum at 50° C. for 12 hours to give a loose white solid (10% yield). The product was confirmed as 6-OTs-α-CD by NMR, and the peaks and chemical shifts of its H NMR are as follows:

$^1$H NMR (300 MHz, D$_2$O, ppm) δ: 2.78-2.81 (q, 1H), 3.03-3.07 (dd, 1H), 3.34-3.38 (m, 1H), 3.44-3.55 (m, 26H), 3.73-3.87 (m, 14H), 3.99-4.04 (m, 1H), 4.95 (s, 7H), 8.04 (m, 4H).

Secondly, α-cyclodextrin modified polymerizable monomers I-1 to I-4 were prepared by polyamine compounds (i.e. Compound II) and polymerizable monomers IV or IV' according to the above steps b and c, wherein said polyamine compounds were ethylenediamine (compound II with k=2), tetraethylenepentamine (compound II with k=5) and Pentaethylenehexamine (compound II with k=6).

Example 1

1) Preparing 6-deoxy-6-tetraethylenepentamine-α-cyclodextrin (Compound III) from the Polyamine Compound of Tetraethylenepentamine According to Step B 1 part by weight of mono-(6-p-toluenesulfonyl)-α-cyclodextrin and 1 part by weight of tetraethylenepentamine were added into a round bottom flask, followed by the addition of 40 parts by weight of N,N-dimethyl formamide (DMF). The mixture was refluxed for 5 hours at 85° C., and then the reaction was stopped and the mixture was cooled. The solvent DMF was distilled off under reduced pressure and the residuals was washed by adding 50 parts by weight of acetone dropwise for three times and dried under vacuum to give 6-deoxy-6-tetraethylenepentamine-α-cyclodextrin (white solid). The product was confirmed by NMR, and the peaks and chemical shifts of its H NMR are as follows:

$^1$H NMR (300 MHz, D$_2$O, ppm) δ: 1.05-1.31 (m, 14H), 2.78-2.81 (m, 5H), 3.04-3.09 (dd, 1H), 3.34-3.40 (m, 1H), 3.44-3.61 (m, 26H), 3.75-3.90 (m, 14H), 3.99-4.06 (m, 1H), 4.97 (s, 6H).

2) Preparing α-Cyclodextrin Modified Polymerizable Monomers I-1 and I-2 from Compound III and Polymerizable Monomer IV-1 or IV-2 Respectively According to Step C a) α-Cyclodextrin Modified Polymerizable Monomers I-1

Synthesis of Polymerizable Monomer IV-1

1 part by weight of trimesic acid, 15 parts by weight of anhydrous tetrahydrofuran as the reaction solvent and 5.4 parts by weight of triethylamine as a acid binding agent were added into a three-necked flask, and then 5.4 parts by weight of acryloyl chloride was slowly added dropwise in an ice-salt bath. After completing the addition, the reactants were heated to 50° C. under stirring overnight. The amine salt was removed by filtration, and the organic layer was washed with water, dried with anhydrous sodium sulfate and then concentrated by oil pump vacuum distillation followed by drying in vacuum to give the product. The chemical equation is as follows:

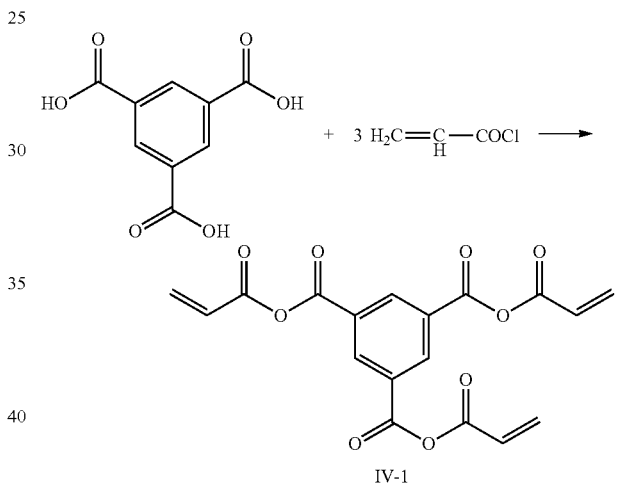

IV-1

Synthesis of α-Cyclodextrin Modified Polymerizable Monomers I-1

1 part by weight of 6-deoxy-6-tetraethylenepentamine-α-cyclodextrin and 1.4 parts by weight of polymerizable monomer IV-1 were added into a four-necked flask, and then 9 parts by weight of methanol was added as a reaction solvent. Under nitrogen (N2) atmosphere, the reactants were stirred for 35 min and then were heated to 50° C. for 6 hours. The solvent was removed by distillation under reduced pressure, and the residuals were dried under vacuum to give 6-deoxy-6-tetraethylenepentamine-α-cyclodextrin modified polymerizable monomer I-1. The product was confirmed by NMR, and the peaks and chemical shifts of its H NMR are as follows:

$^1$H NMR (300 MHz, D$_2$O, ppm) δ: 2.0 (s, 5H), 2.49-2.81 (m, 28H), 3.02-3.79 (m, 28H), 4.0-4.15 (m, 6H), 5.03 (s, 6H), 5.50-6.10 (m, 6H), 8.94 (s, 3H).

The synthesis route of 6-deoxy-6-tetraethylenepentamine-α-cyclodextrin modified polymerizable monomer I-1 is as follows:

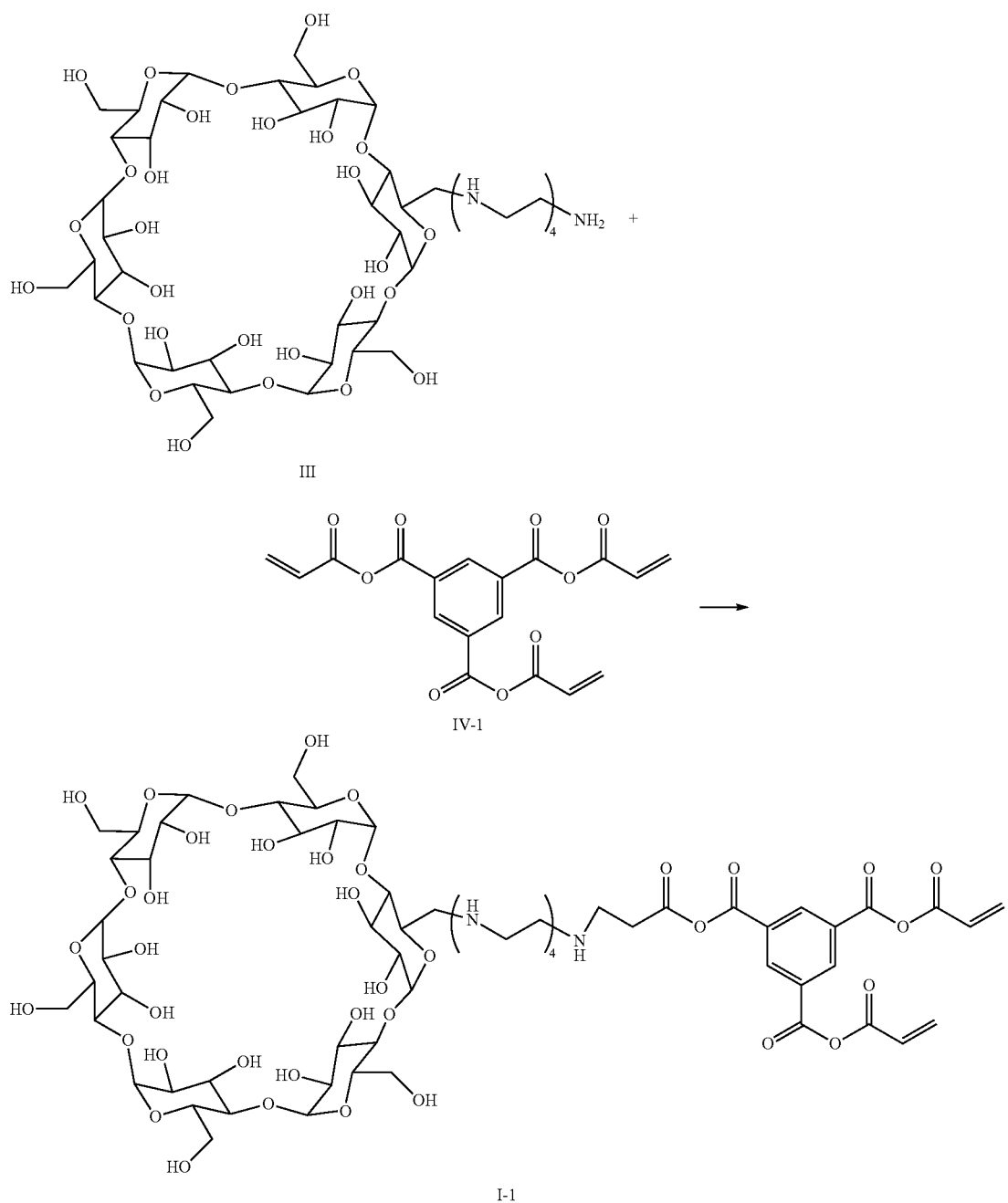

b) α-Cyclodextrin Modified Polymerizable Monomers I-2

Synthesis of Polymerizable Monomer IV-2

1 part by weight of 2,6-naphthalic acid, 20 parts by weight of anhydrous tetrahydrofuran as the reaction solvent and 2 parts by weight of triethylamine as a acid binding agent were added into a three-necked flask, and then 2 parts by weight of acryloyl chloride was slowly added dropwise in an ice-salt bath. After completing the addition, the reactants were heated to 70° C. under stirring overnight. The amine salt was removed by filtration, and the organic layer was washed with water, dried with anhydrous sodium sulfate and then concentrated by oil pump vacuum distillation followed by drying in vacuum to give the product. The chemical equation is as follows:

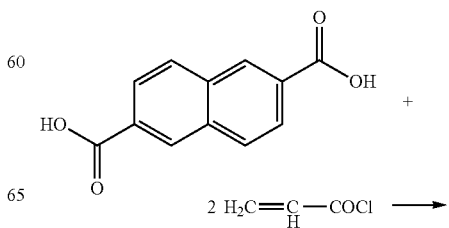

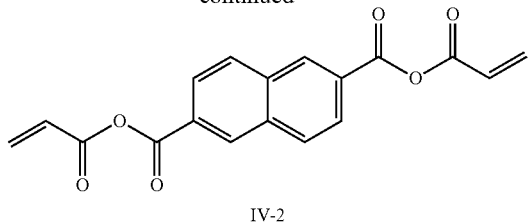

IV-2

Synthesis of α-Cyclodextrin Modified Polymerizable Monomers I-2

1 part by weight of 6-deoxy-6-tetraethylenepentamine-α-cyclodextrin and 1.5 parts by weight of polymerizable monomer IV-2 were added into a four-necked flask, and then 8 parts by weight of methanol was added as a reaction solvent. Under nitrogen (N2) atmosphere, the reactants were stirred for 30 min and then were heated to 50° C. for 5 hours. The solvent was removed by distillation under reduced pressure, and the residuals were dried under vacuum to give 6-deoxy-6-tetraethylenepentamine-α-cyclodextrin modified polymerizable monomer I-2. The product was confirmed by NMR, and the peaks and chemical shifts of its H NMR are as follows:

1H NMR (300 MHz, D$_2$O, ppm) δ: 2.15 (s, 5H), 2.45-2.83 (m, 28H), 3.05-3.72 (m, 26H), 4.03-4.19 (m, 6H), 5.03 (s, 6H), 5.55-6.14 (m, 3H), 8.01 (s, 2H), 8.31 (s, 2H), 8.66 (s, 2H).

The synthesis route of 6-deoxy-6-tetraethylenepentamine-α-cyclodextrin modified polymerizable monomer I-2 is as follows:

Example 2

1) Preparing 6-Deoxy-6-Pentaethylenehexamine-α-Cyclodextrin (Compound III) from the Polyamine Compound of Pentaethylenehexamine According to Step B 1 part by weight of mono-(6-p-toluenesulfonyl)-α-cyclodextrin and 1 part by weight of pentaethylenehexamine were added into a round bottom flask, followed by the addition of 55 parts by weight of N,N-dimethyl formamide (DMF). The mixture was refluxed for 7 hours at 90° C., and then the reaction was stopped and the mixture was cooled. The solvent DMF was distilled off under reduced pressure and the residuals was washed by adding 60 parts by weight of acetone dropwise for three times and dried under vacuum to give 6-deoxy-6-pentaethylenehexamine-α-cyclodextrin. The product was confirmed by NMR, and the peaks and chemical shifts of its H NMR are as follows:

$^1$H NMR (300 MHz, D$_2$O, ppm) δ: 1.07-1.38 (m, 18H), 2.76-2.83 (m, 6H), 3.03-3.07 (dd, 1H), 3.32-3.39 (m, 1H), 3.42-3.69 (m, 26H), 3.77-3.94 (m, 14H), 4.01-4.07 (m, 1H), 5.01 (s, 6H).

2) Preparing α-Cyclodextrin Modified Polymerizable Monomers I-3 from Compound III and polymerizable monomer IV-3 according to Step C

Synthesis of Polymerizable Monomer IV-3

1 part by weight of Diethylene glycol diglycidyl ether and 3.2 parts by weight of acryloyl chloride were added into a three-necked flask, and then 20 parts by weight N,N-dimethyl formamide as the reaction solvent and 0.3 parts by weight of imidazole as reaction promotor were added too. Under nitrogen (N$_2$) atmosphere, the reactants were heated to 120° C. under stirring and the reaction was kept for 12 hours. The solvent was removed by distillation under reduced pressure, and the residuals were dried under vacuum to give the polymerizable monomer IV-3. The chemical equation is as follows:

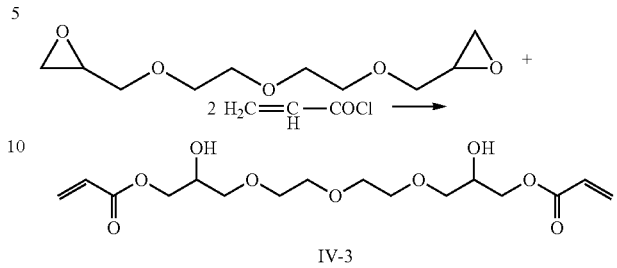

Synthesis of α-Cyclodextrin Modified Polymerizable Monomers I-3

1 part by weight of 6-deoxy-6-pentaethylenehexamine-α-cyclodextrin and 1.4 parts by weight of polymerizable monomer IV-3 were added into a four-necked flask, and then 13 parts by weight of methanol was added as a reaction solvent. Under nitrogen (N$_2$) atmosphere, the reactants were stirred for 40 min and then were heated to 60° C. for 67 hours. The solvent was removed by distillation under reduced pressure, and the residuals were dried under vacuum to give 6-deoxy-6-pentaethylenehexamine-α-cyclodextrin modified polymerizable monomer I-3. The product was confirmed by NMR, and the peaks and chemical shifts of its H NMR are as follows:

$^1$H NMR (300 MHz, D$_2$O, ppm) δ: 2.0 (s, 6H), 3.02 (s, 6H), 3.58 (s, 14H), 3.63 (s, 5H), 3.65 (dd, 4H), 3.73-3.79 (m, 24H), 4.14-4.16 (m, 3H), 4.36-4.42 (m, 4H), 4.0 (m, 5H), 5.03 (s, 6H).

The synthesis route of 6-deoxy-6-pentaethylenehexamine-α-cyclodextrin modified polymerizable monomer I-3 is as follows:

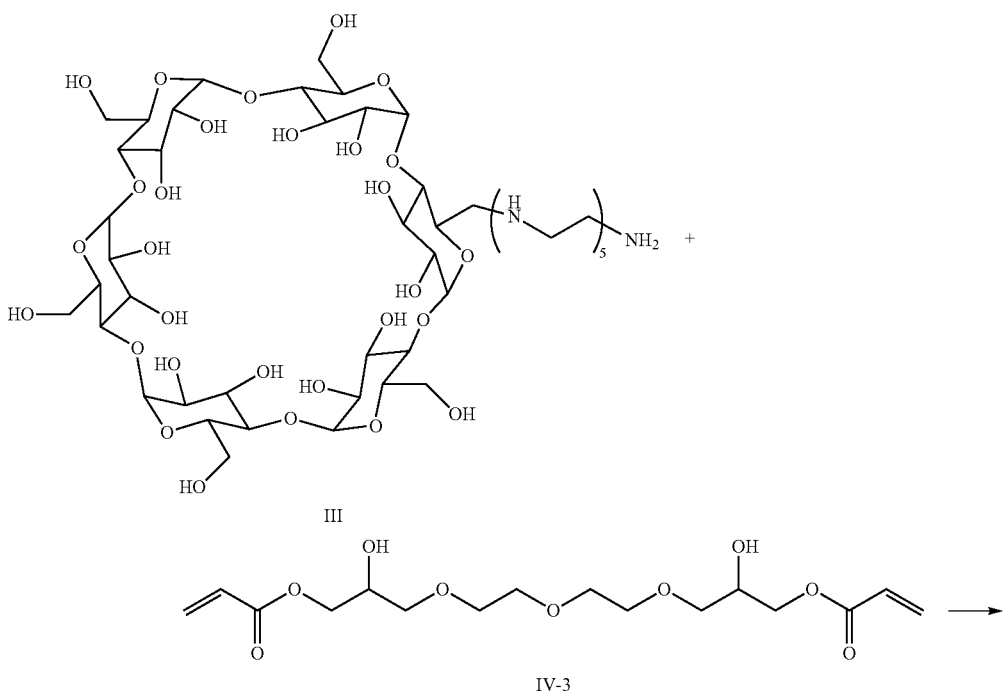

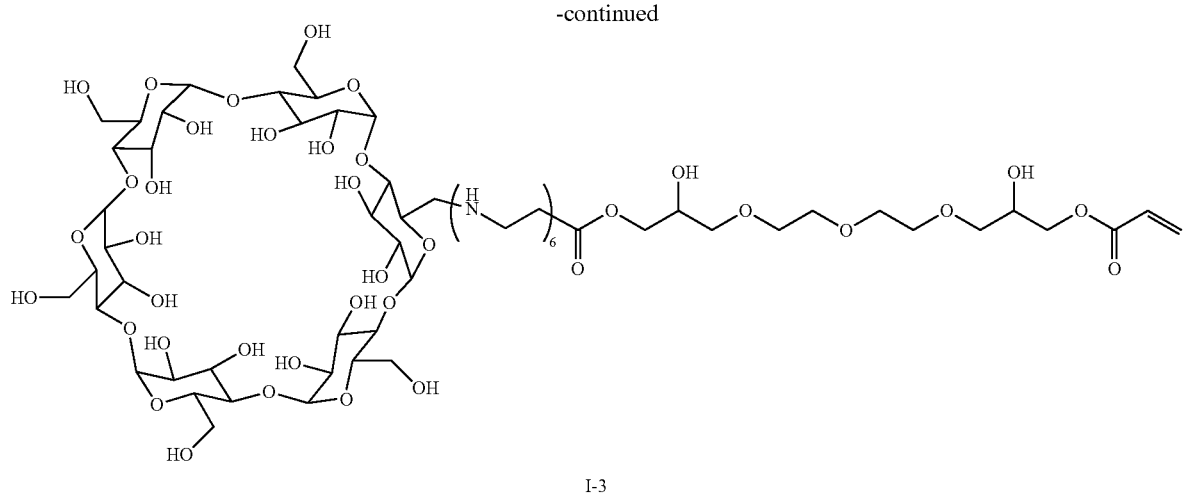

I-3

Example 3

1) Preparing 6-Deoxy-6-Ethylenediamine-α-Cyclodextrin (Compound III) from the Polyamine Compound of Ethylenediamine According to Step B 1 part by weight of mono-(6-p-toluenesulfonyl)-α-cyclodextrin and 1 part by weight of ethylenediamine were added into a round bottom flask, followed by the addition of 50 parts by weight of N,N-dimethyl formamide (DMF). The mixture was refluxed for 7 hours at 70° C., and then the reaction was stopped and the mixture was cooled. The solvent DMF was distilled off under reduced pressure and the residuals was washed by adding 60 parts by weight of acetone dropwise for three times and dried under vacuum to give 6-deoxy-6-ethylenediamine-α-cyclodextrin (white solid). The product was confirmed by NMR, and the peaks and chemical shifts of its H NMR are as follows:

$^1$H NMR (300 MHz, D$_2$O, ppm) δ: 2.78-2.81 (m, 4H), 3.03-3.07 (dd, 1H), 3.34-3.38 (m, 1H), 3.44-3.55 (m, 26H), 3.73-3.87 (m, 14H), 3.99-4.04 (m, 1H), 4.95 (s, 7H).

2) Preparing α-Cyclodextrin Modified Polymerizable Monomers I-4 from Compound III and Polymerizable Monomer IV-4 According to Step C

Synthesis of Polymerizable Monomer IV-4

1 part by weight of Glycerol triglycidyl ether (also known as 1,2,3-Tris(2,3-epoxypropoxy)propane) and 5 parts by weight of acryloyl chloride were added into a three-necked flask, and then 25 parts by weight N,N-dimethyl formamide as the reaction solvent and 0.4 parts by weight of imidazole as reaction promotor were added too. Under nitrogen (N$_2$) atmosphere, the reactants were heated to 140° C. under stirring and the reaction was kept for 24 hours. The solvent was removed by distillation under reduced pressure, and the residuals were dried under vacuum to give the polymerizable monomer IV-4. The chemical equation is as follows:

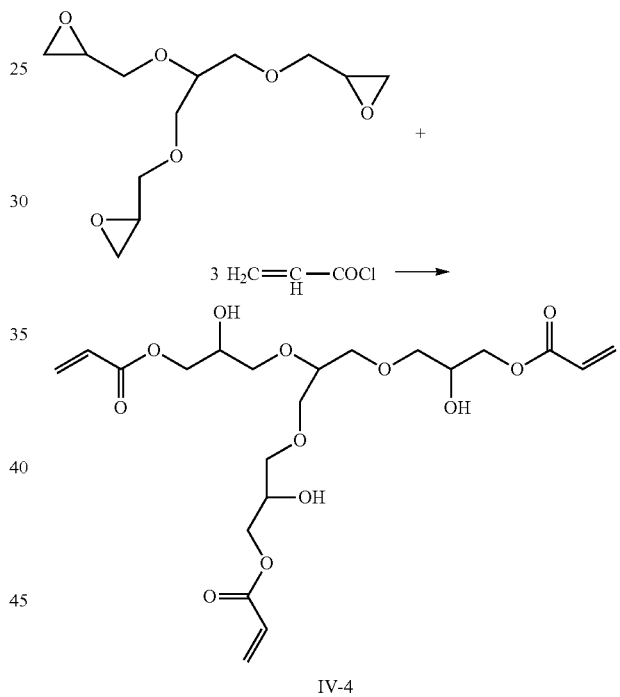

IV-4

Synthesis of α-Cyclodextrin Modified Polymerizable Monomers I-4

1 part by weight of 6-deoxy-6-ethylenediamine-α-cyclodextrin and 1.2 parts by weight of polymerizable monomer IV-4 were added into a four-necked flask, and then 15 parts by weight of methanol was added as a reaction solvent. Under nitrogen (N$_2$) atmosphere, the reactants were stirred for 50 min and then were heated to 60° C. for 7 hours. The solvent was removed by distillation under reduced pressure, and the residuals were dried under vacuum to give 6-deoxy-6-ethylenediamine-α-cyclodextrin modified polymerizable monomer I-4. The product was confirmed by NMR, and the peaks and chemical shifts of its H NMR are as follows:

$^1$H NMR (300 MHz, D$_2$O, ppm) δ: 2.01 (s, 2H), 2.52-2.94 (m, 10H), 3.04 (s, 6H), 3.56 (s, 15H), 3.61 (s, 5H), 3.67 (dd, 4H), 3.73-3.79 (m, 22H), 4.13-4.17 (m, 3H), 4.38-4.44 (m, 6H), 4.01 (m, 5H), 5.59-6.27 (m, 6H).

The synthesis route of 6-deoxy-6-tetraethylenepentamine-α-cyclodextrin modified polymerizable monomer I-4 is as follows:

Preparation of Photoresist Compositions

Photoresist compositions I-4 were prepared respectively from the 6-deoxy-6-tetraethylenepentamine-α-cyclodextrin modified polymerizable monomers I-1 to I-4 of Example 1-3 and other components used for a photoresist composition.

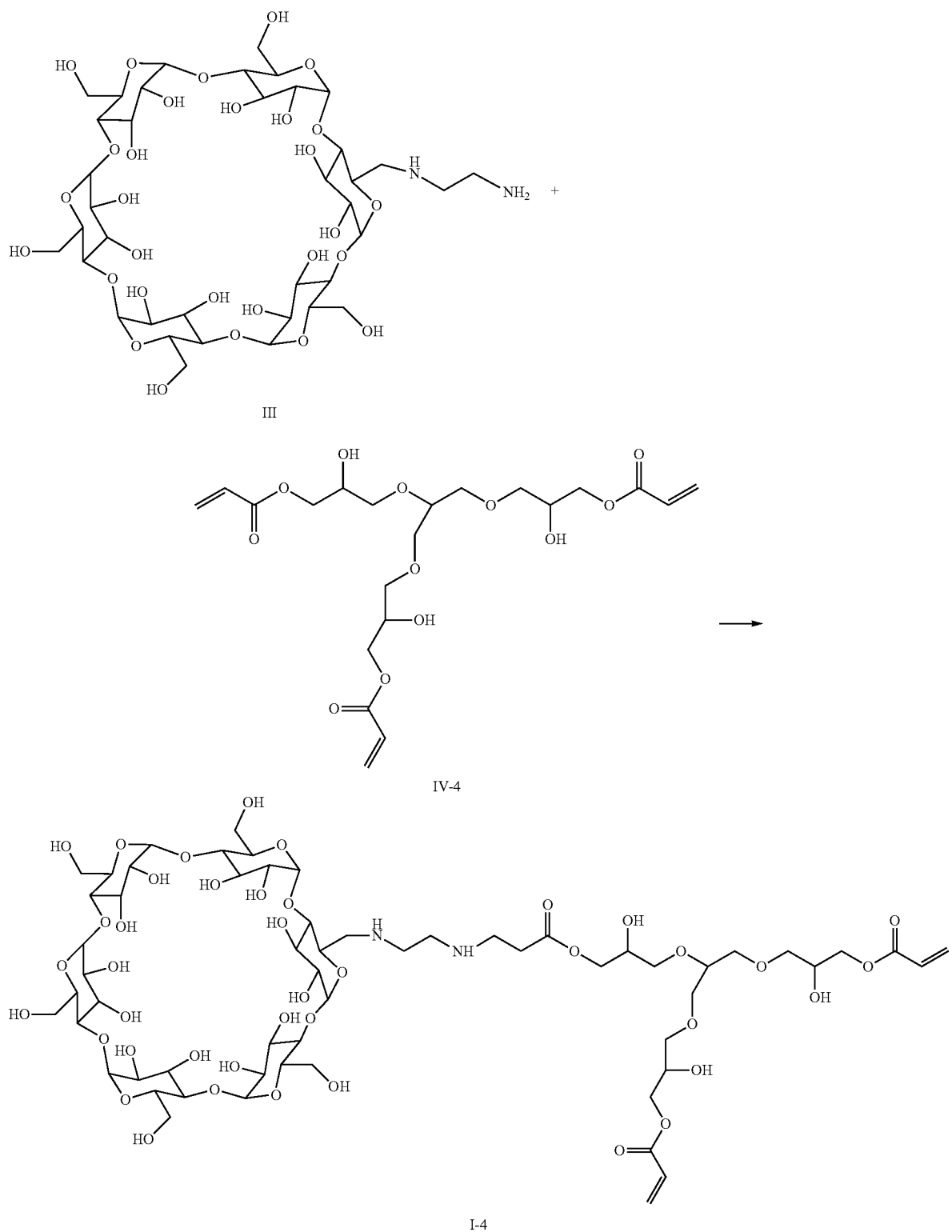

Preparation of Photoresist Composition 1

The mixture of 2.3 parts by weight of the α-cyclodextrin modified polymerizable monomers I-1, 10 parts by weight of polymerizable monomer with high functionality, 4.3 parts by weight of an alkali-soluble resin, 15 parts by weight of a pigment dispersion, 0.1 parts by weight of a photoinitiator, 0.05 parts by weight of an additive and 20 parts by weight of an organic solvent were stirred under low speed for 10 hours to obtain the photoresist composition 1.

Preparation of Photoresist Composition 2

The mixture of 6.5 parts by weight of the α-cyclodextrin modified polymerizable monomers I-2, 18.6 parts by weight of polymerizable monomer with high functionality, 15.8 parts by weight of an alkali-soluble resin, 27.3 parts by weight of a pigment dispersion, 0.35 parts by weight of a photoinitiator, 0.07 parts by weight of an additive and 23 parts by weight of an organic solvent were stirred under low speed for 11 hours to obtain the photoresist composition 2.

Preparation of Photoresist Composition 3

The mixture of 7.8 parts by weight of the α-cyclodextrin modified polymerizable monomers I-3, 13.5 parts by weight of polymerizable monomer with high functionality, 3.2 parts by weight of an alkali-soluble resin, 20 parts by weight of a pigment dispersion, 0.3 parts by weight of a photoinitiator, 0.04 parts by weight of an additive and 27 parts by weight of an organic solvent were stirred under low speed for 12 hours to obtain the photoresist composition 3.

Preparation of Photoresist Composition 4

The mixture of 8.6 parts by weight of the α-cyclodextrin modified polymerizable monomers I-4, 20 parts by weight of polymerizable monomer with high functionality, 12.6 parts by weight of an alkali-soluble resin, 30 parts by weight of a pigment dispersion, 0.8 parts by weight of a photoinitiator, 0.09 parts by weight of an additive and 30 parts by weight of an organic solvent were stirred under low speed for 12 hours to obtain the photoresist composition 4.

Comparative Example 1

Preparation of Photoresist Composition 5

The mixture of 5.6 parts by weight of multi-functional monomer having aromatic ring structure, 10 parts by weight of polymerizable monomer with high functionality, 4.4 parts by weight of an alkali-soluble resin, 15 parts by weight of a pigment dispersion, 0.3 parts by weight of a photoinitiator, 0.049 parts by weight of an additive and 20 parts by weight of an organic solvent were stirred under low speed for 10 hours to obtain the photoresist composition 5.

Comparative Example 2

Preparation of Photoresist Composition 6

The mixture of 8.6 parts by weight of multi-functional monomer having ether structure, 20 parts by weight of polymerizable monomer with high functionality, 12.6 parts by weight of an alkali-soluble resin, 27.3 parts by weight of a pigment dispersion, 0.35 parts by weight of a photoinitiator, 0.07 parts by weight of an additive and 27 parts by weight of an organic solvent were stirred under low speed for 12 hours to obtain the photoresist composition 6.

Test Method

Photoresist compositions 1 to 6 were coated respectively on glass substrates with black matrix layer to obtain sheets 1 to 6, wherein the coated films have a thickness of 2.0 microns. The sheets were baked for 2 minutes at 100° C. in oven, and then were exposed under ultraviolet light with an intensity of 125 mJ/cm$^2$ by an exposure machine and developed in a developing liquid for 25-50 seconds at room temperature, followed by washing with deionized water and drying, so as to obtain a cured film (i.e. a color photoresist). The chroma and transmittance of the cured film before post-baking were tested. The cured films were post-baked at 230° C. for 30 min in an oven, and the chroma and transmittance of the cured film after post-baking were tested. The above tests were performed according to CIE1931xy and CIE1976LAB systems and the results were shown in Table 1, wherein Y indicates the brightness or the transmittance, L was psychrometric lightness, and a and b were psychrometric chroma.

TABLE 1

|   | sheet1 | sheet2 | sheet3 | sheet4 | sheet5 | sheet6 |
|---|---|---|---|---|---|---|
|   | before post-baking | | | | | |
| Y | 16.727 | 16.737 | 16.366 | 16.437 | 14.562 | 13.962 |
| x | 0.143 | 0.144 | 0.143 | 0.144 | 0.144 | 0.144 |
| y | 0.135 | 0.136 | 0.135 | 0.136 | 0.136 | 0.136 |
| L | 47.914 | 47.543 | 47.451 | 47.543 | 45.394 | 44.968 |
| a | 7.292 | 6.935 | 7.352 | 6.935 | 9.422 | 9.852 |
| b | −71.589 | −70.634 | −71.196 | −70.634 | −72.345 | −73.158 |
|   | after post-baking | | | | | |
| Y | 16.703 | 16.654 | 16.181 | 16.654 | 12.189 | 11.562 |
| x | 0.143 | 0.144 | 0.143 | 0.144 | 0.142 | 0.142 |
| y | 0.135 | 0.136 | 0.135 | 0.136 | 0.141 | 0.141 |
| L | 47.884 | 47.821 | 47.221 | 47.821 | 42.394 | 42.394 |
| a | 7.586 | 6.789 | 7.431 | 6.789 | 12.422 | 12.748 |
| b | −71.785 | −70.862 | −71.122 | −70.826 | −73.345 | −74.021 |

According to the chroma difference formula:

$$\Delta E = \sqrt{(L_1 - L_2)^2 + (a_1 - a_2)^2 + (b_1 - b_2)^2},$$

the chroma difference ΔE of sheets 1-6 were 0.5069, 0.9112, 0.2632, 0.3880, 3.1214 and 3.0684. As shown in Table 1, the chroma coordinates and chroma differences of sheet 1, sheet 2, sheet 3 and sheet 4 are small, and the chroma coordinates of sheet 5 and sheet 6 varied greatly, and the chroma differences thereof were about 3.

In terms of the transmittance, the chroma coordinates Y of sheet 1, sheet 2, sheet 3 and sheet 4 were 16 or more and the value of Y showed little change after post-baking; whereas, the chroma coordinates Y of sheet 5 and sheet 6 are significantly less than those of sheets 1-4 and the value of Y obviously became much smaller after post-baking, which means that the transmittance became lower.

It can be seen that the photoresist prepared from the photoresist composition comprising the cyclodextrin derivatives of the present invention has smaller chroma differences (i.e. the yellowing phenomenon of the photoresist being improved) and higher transmittance.

It is understood that the present invention is not limited to the above-illustrated embodiments, which were chosen and described in order to best explain the principles of the invention. Those skilled in the art can make various modifications or variations without departing from the spirit and essence of the present invention. It is intended that the scope of the invention be defined by the following claims and their equivalents.

The invention claimed is:

1. A α-cyclodextrin modified polymerizable monomer represented by the following formula I or I':

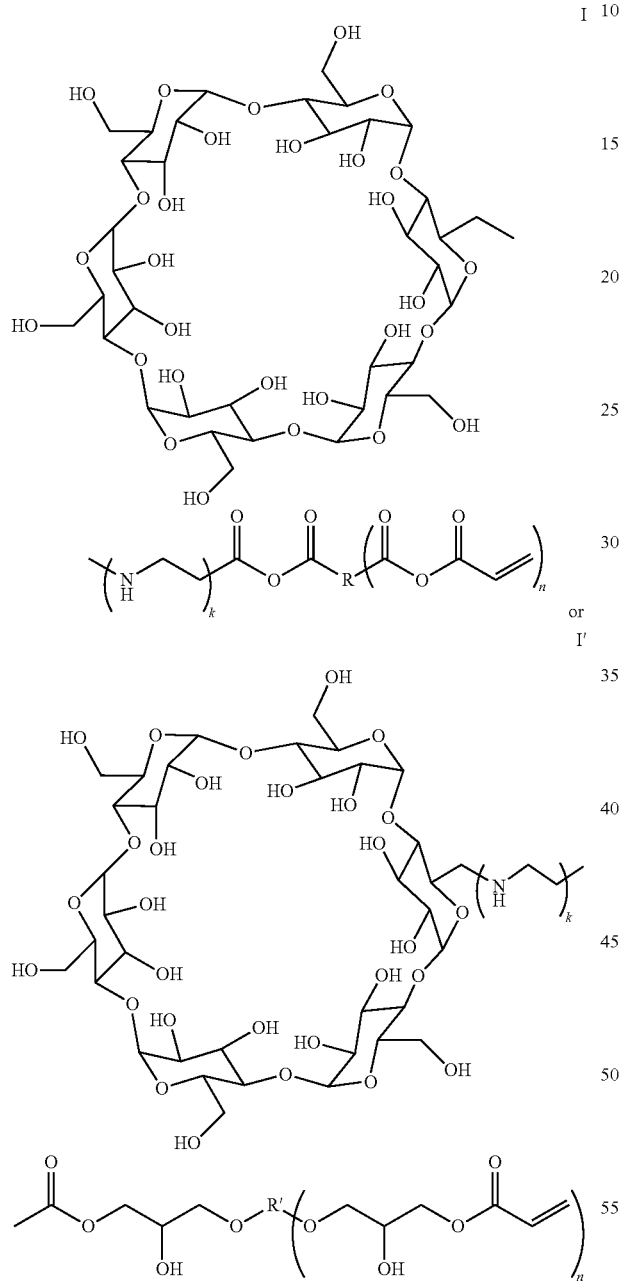

wherein k is any integer selected from 2-6, n is any integer selected from 1-3, R is an aromatic ring having 5 to 30 carbon atoms, R' is a multivalent straight or branched carbon chain having 5 to 30 carbon atoms which is optionally interrupted by an oxygen atom.

2. The α-cyclodextrin modified polymerizable monomer according to claim 1, wherein R includes phenyl ketone, or naphthyl ketone, and R' is the carbon chain of glycerol ethers.

3. A photoresist composition, comprising:
2.3 to 8.6 parts by weight of a α-cyclodextrin modified polymerizable monomer;
10 to 20 parts by weight of a polymerizable monomer with high functionality;
3.2 to 15.8 parts by weight of an alkali-soluble resin;
15 to 30 parts by weight of a pigment dispersion;
0.1 to 0.8 parts by weight of a photoinitiator; and
20 to 30 parts by weight of an organic solvent,
wherein the α-cyclodextrin modified polymerizable monomer has a structure represented by the following formula I or I':

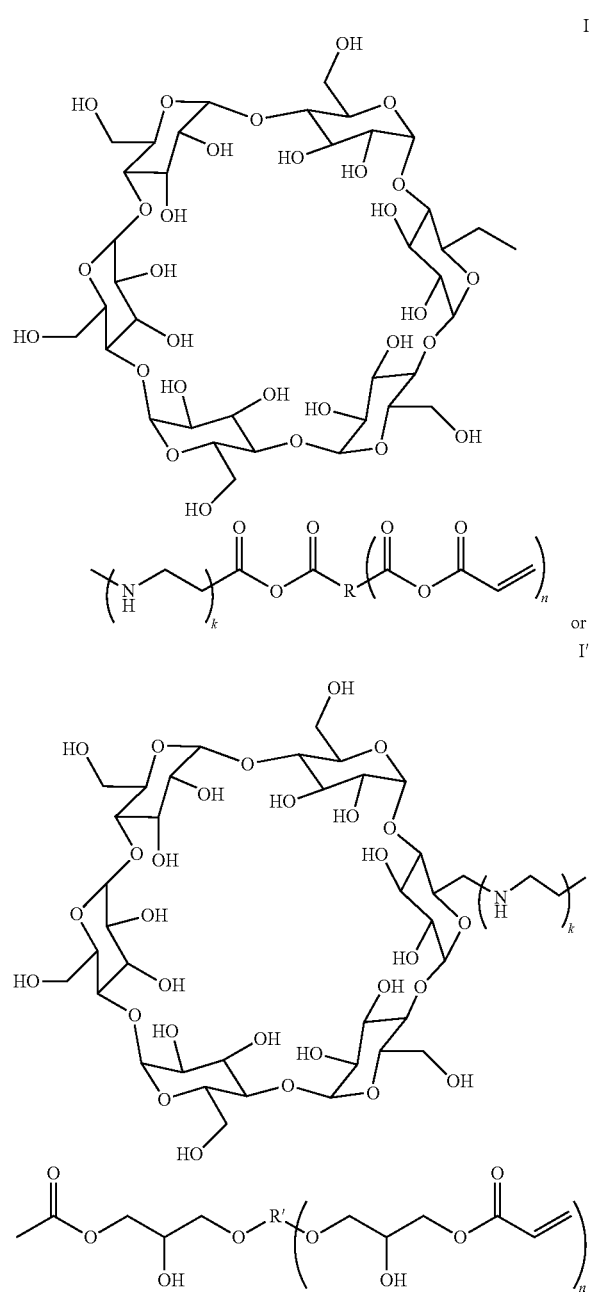

wherein k is any integer selected from 2-6, n is any integer selected from 1-3, R is an aromatic ring having 5 to 30 carbon atoms, R' is a multivalent straight or branched carbon chain having 5 to 30 carbon atoms which is optionally interrupted by an oxygen atom.

4. The photoresist composition according to claim 3, wherein the α-cyclodextrin modified polymerizable monomer is in a range of 2.5 to 4.5 parts by weight; the polymerizable monomer with high functionality is in a range of 13 to 15 parts by weight; the alkali-soluble resin is in a range of 5 to 7 parts by weight; the pigment dispersion is in a range of 20 to 25 parts by weight; the photoinitiator agent is in a range of 0.3 to 0.5 parts by weight; the organic solvent is in a range of 25 to 27 parts by weight.

5. The photoresist composition according to claim 3, wherein the polymerizable monomers with high functionality include dipentaerythritol pentaacrylate, dipentaerythritol hexaacrylate, or di-trimethylolpropane tetraacrylate; the alkali-soluble resin includes acrylic resin; the pigment dispersion includes a red pigment dispersion, a green pigment dispersion or a blue pigment dispersion; the photoinitiator includes 4,4'-diphenyl iodonium hexafluoroantimonate, mixed-type of triaryl sulfonium hexafluoroantimonate, (5-Cyclopentadienyl)(6-isopropylbenzene)iron hexafluorophosphate or 1-(4-(phenylthio)phenyl)-1,2-octanedione-2-(O-benzoyl oxime); the organic solvent includes any one or more of propylene glycol methyl ether acetate, propylene glycol diacetate, 3-ethoxy-3-imino ethyl propionate, 2-methyl heptane, 3-methyl heptane, cyclopentanone and cyclohexanone.

6. The photoresist composition according to claim 3, wherein the photoresist composition further comprises 0.04 to 0.09 parts by weight of additives, the additives being a surfactant or a leveling agent.

7. A color photoresist obtained from a photoresist composition comprising:
  2.3 to 8.6 parts by weight of a α-cyclodextrin modified polymerizable monomer;
  10 to 20 parts by weight of a polymerizable monomer with high functionality;
  3.2 to 15.8 parts by weight of an alkali-soluble resin;
  15 to 30 parts by weight of a pigment dispersion;
  0.1 to 0.8 parts by weight of a photoinitiator; and
  20 to 30 parts by weight of an organic solvent,
  wherein the α-cyclodextrin modified polymerizable monomer has a structure represented by the following formula I or I':

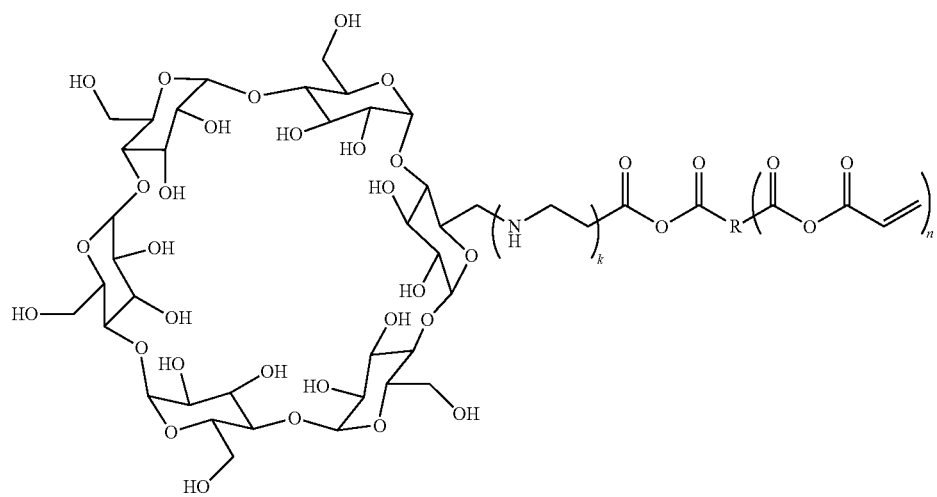

I or

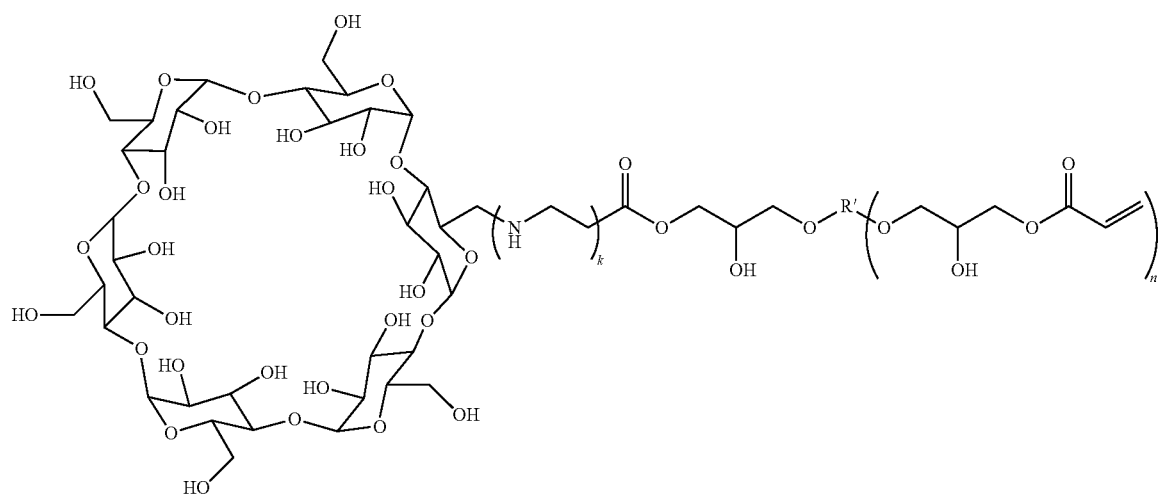

I' wherein k is any integer selected from 2-6, n is any integer selected from 1-3, R is an aromatic ring having 5 to 30 carbon atoms, R' is a multivalent straight or branched carbon chain having 5 to 30 carbon atoms which is optionally interrupted by an oxygen atom.

8. A display apparatus comprising a color photoresist obtained from a photoresist composition which comprises:
   2.3 to 8.6 parts by weight of a α-cyclodextrin modified polymerizable monomer;
   10 to 20 parts by weight of a polymerizable monomer with high functionality;
   3.2 to 15.8 parts by weight of an alkali-soluble resin;
   15 to 30 parts by weight of a pigment dispersion;
   0.1 to 0.8 parts by weight of a photoinitiator; and
   20 to 30 parts by weight of an organic solvent,
   wherein the α-cyclodextrin modified polymerizable monomer has a structure represented by the following formula I or

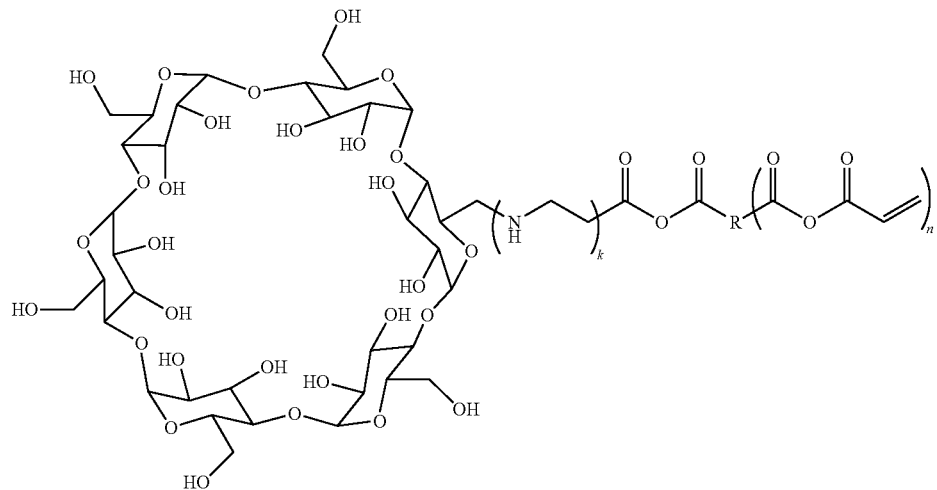

or

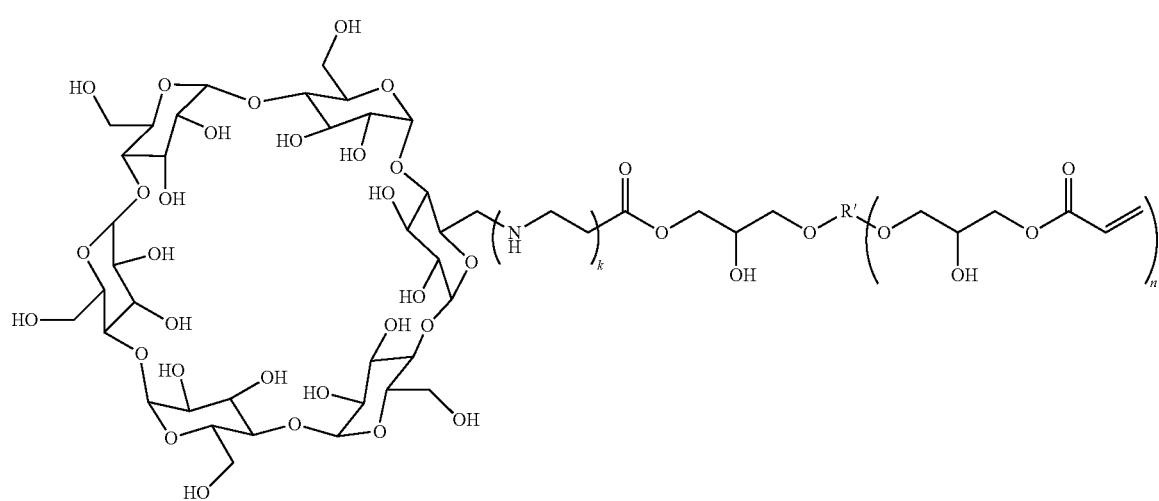

wherein k is any integer selected from 2-6, n is any integer selected from 1-3, R is an aromatic ring having 5 to 30 carbon atoms, R' is a multivalent straight or branched carbon chain having 5 to 30 carbon atoms which is optionally interrupted by an oxygen atom.

9. A method for preparing a α-cyclodextrin modified polymerizable monomer, comprising:

Step A: performing an esterification reaction of α-cyclodextrin and p-toluenesulfonyl chloride under basic condition to form mono-(6-p-toluenesulfonyl)-α-cyclodextrin according to the chemical equation as below:

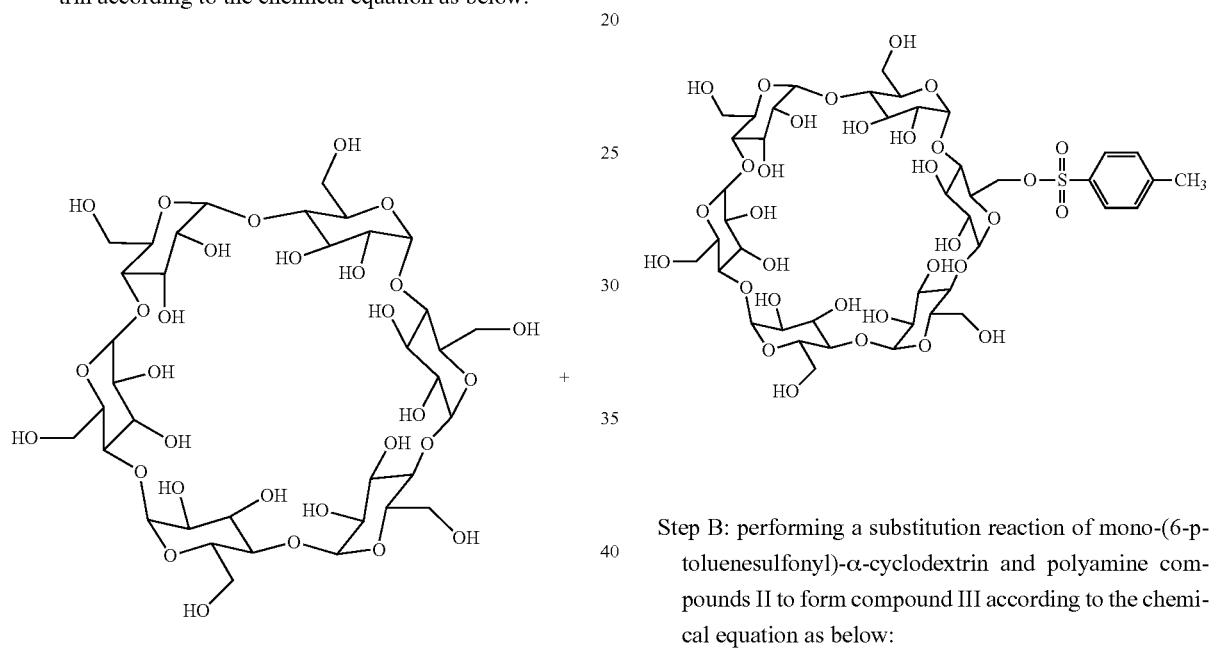

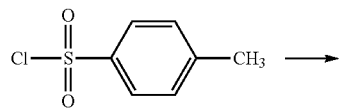

Step B: performing a substitution reaction of mono-(6-p-toluenesulfonyl)-α-cyclodextrin and polyamine compounds II to form compound III according to the chemical equation as below:

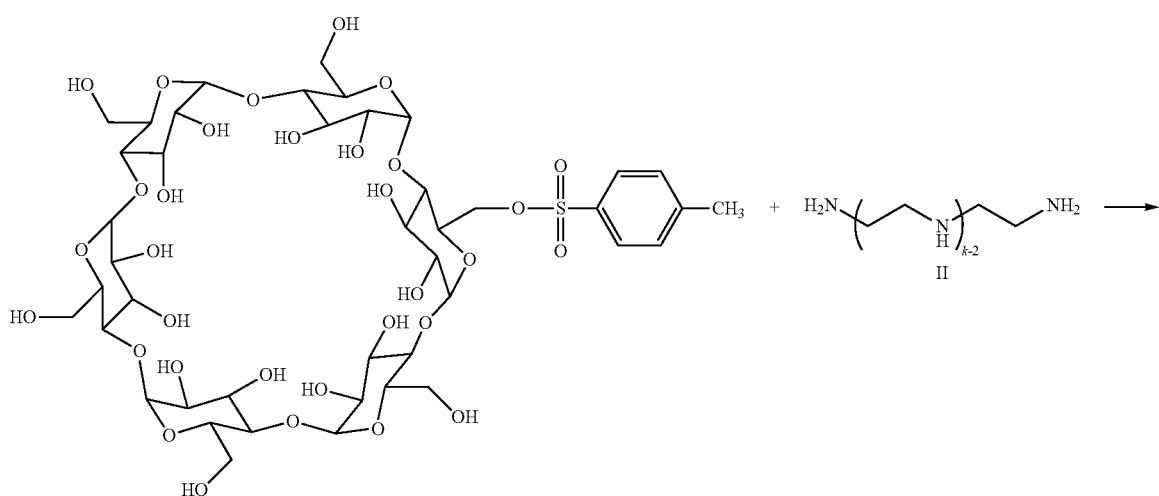

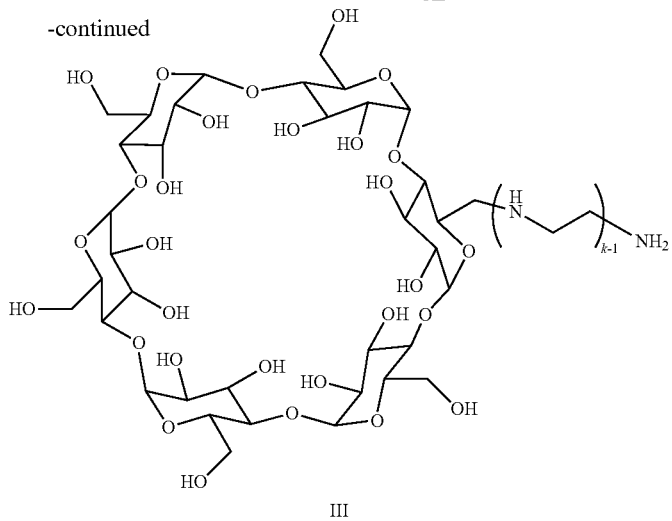
III
Step C: performing an addition reaction of compound III and polymerizable monomer IV or IV' to form a compound represented by formula I or I' according to the chemical equation as below:
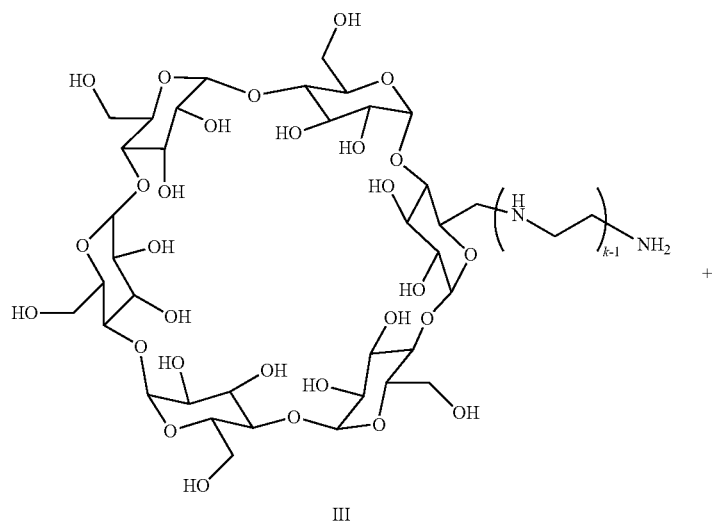
III
+
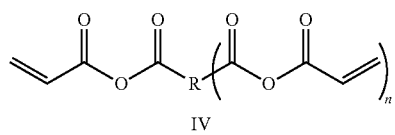
IV
or
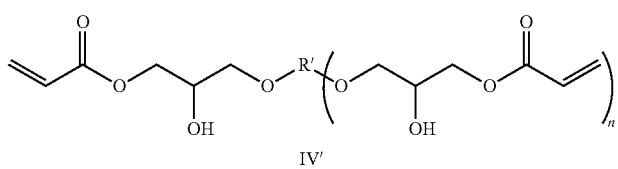
IV'
→

-continued
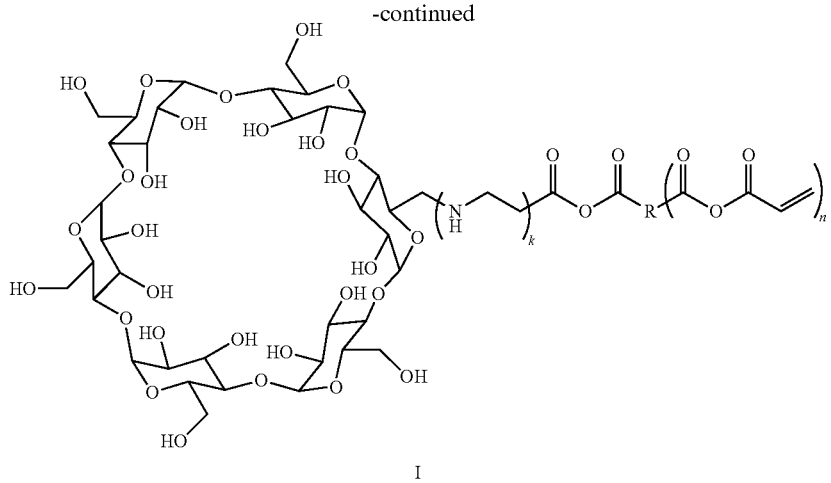
I
or
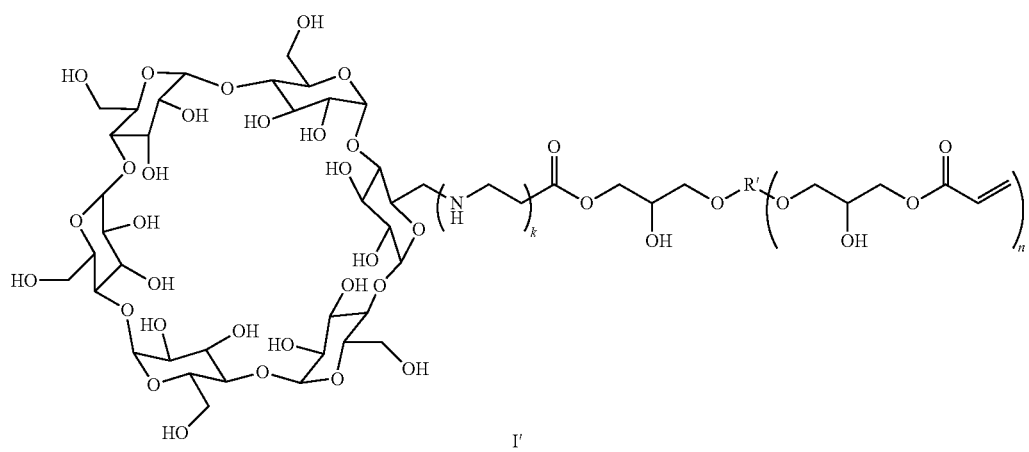
I'
wherein k is any integer selected from 2-6, n is any integer selected from 1-3, R is an aromatic ring having 5 to 30 carbon atoms, R' is a multivalent straight or branched carbon chain having 5 to 30 carbon atoms which is optionally interrupted by an oxygen atom.
* * * * *